(12) United States Patent
Han

(10) Patent No.: US 11,696,520 B2
(45) Date of Patent: Jul. 4, 2023

(54) SEMICONDUCTOR DEVICE HAVING THREE-DIMENSIONAL CELL STRUCTURE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 69 days.

(21) Appl. No.: 17/220,271

(22) Filed: Apr. 1, 2021

(65) Prior Publication Data
US 2022/0140238 A1 May 5, 2022

(30) Foreign Application Priority Data

Oct. 29, 2020 (KR) .................. 10-2020-0142565

(51) Int. Cl.
*H10N 70/00* (2023.01)
*G11C 13/00* (2006.01)

(52) U.S. Cl.
CPC ..... *H10N 70/8828* (2023.02); *G11C 13/0004* (2013.01); *G11C 13/0026* (2013.01); *G11C 13/0028* (2013.01); *H10N 70/021* (2023.02); *H10N 70/061* (2023.02); *H10N 70/882* (2023.02); *H10N 70/8825* (2023.02); *H10N 70/8845* (2023.02)

(58) Field of Classification Search
CPC ... H01L 45/144; H01L 45/141; H01L 45/143; H01L 45/149; H01L 45/1608; H01L 45/1666; H01L 27/2463; H01L 45/16; H01L 27/2481; H01L 45/1233; G11C 13/0004; G11C 13/0026; G11C 13/0028; G11C 2213/77; G11C 13/0069; H10N 70/8828; H10N 70/021; H10N 70/061; H10N 70/882; H10N 70/8825; H10N 70/8845; H10N 70/20; H10N 70/823; H10N 70/011; H10N 70/826; H10B 63/845; H10B 63/80; H10B 63/84
See application file for complete search history.

(56) References Cited

U.S. PATENT DOCUMENTS

| | | | |
|---|---|---|---|
| 9,240,222 B2 | 1/2016 | Toriyama | |
| 9,570,683 B1* | 2/2017 | Jo | ............ H01L 45/085 |
| 2017/0084834 A1 | 3/2017 | Kim et al. | |
| 2019/0088720 A1* | 3/2019 | Ishikawa | ............ H01L 45/1683 |
| 2019/0378568 A1* | 12/2019 | Robustelli | .......... G11C 13/0023 |
| 2019/0378571 A1* | 12/2019 | Pirovano | .............. G11C 13/003 |
| 2021/0202841 A1* | 7/2021 | Good | .................... H01L 45/143 |

* cited by examiner

*Primary Examiner* — Jerome Leboeuf

(57) ABSTRACT

A semiconductor device includes a substrate, a plurality of word line structures disposed over the substrate to be spaced apart from each other in a first direction perpendicular to a surface of the substrate. Each of the plurality of word line structures extends in a second direction parallel to the surface of the substrate. In addition, the semiconductor device includes a switching layer disposed over the substrate to contact side surfaces of the plurality of word line structures, and bit line structures disposed over the substrate to extend in the first direction and to contact a surface of the switching layer. The switching layer is configured to perform a threshold switching operation, and has a variable programmable threshold voltage.

8 Claims, 26 Drawing Sheets

SEMICONDUCTOR DEVICE HAVING THREE-DIMENSIONAL CELL STRUCTURE

CROSS-REFERENCE TO RELATED APPLICATIONS

The present application claims priority under 35 U.S.C. § 119(a) to Korean Application No. 10-2020-0142565, filed on Oct. 29, 2020 in the Korean Intellectual Property Office, which is incorporated herein by reference in its entirety.

BACKGROUND

1. Technical Field

The present disclosure generally relates to a semiconductor device and, more particularly, to a semiconductor device having a three-dimensional cell structure and a method of manufacturing the same.

2. Related Art

Recently, semiconductor devices having a three-dimensional structure, compared to devices with a planar structure, have emerged. A semiconductor device having a three-dimensional structure has an advantage of being able to effectively respond to a request for reduction in design rules and for an increase in integration degree in the industry. In particular, in the field of memory technology that requires both high integration and high capacity, research on the semiconductor devices with three-dimensional structures has been actively conducted.

SUMMARY

A semiconductor device according to an aspect of the present disclosure may include a substrate, a plurality of word line structures disposed over the substrate to be spaced apart from each other in a first direction perpendicular to a surface of the substrate. Each of the plurality of word line structures may extend in a second direction parallel to the surface of the substrate. In addition, the semiconductor device may include a switching layer disposed over the substrate to contact side surfaces of the plurality of word line structures, and bit line structures disposed over the substrate to extend in the first direction and to contact a surface of the switching layer. The switching layer may be configured to perform a threshold switching operation and have a variable programmable threshold voltage.

Disclosed is a method of manufacturing a semiconductor device according to another aspect of the present disclosure. In the method, a substrate having a base insulation layer may be provided. A plurality of first word line structures extending in a first lateral direction parallel to a surface of the substrate and a first switching functional layer disposed between the plurality of first word line structures may be formed over the base insulation layer. The plurality of first word line structures may be spaced apart from each other in a second lateral direction, which is parallel to the surface of the substrate and perpendicular to the first lateral direction, over the base insulation layer. A first interlayer insulation layer may be formed on the plurality of first word line structures and the first switching functional layer. A plurality of second word line structures extending in the first lateral direction and a second switching functional layer disposed between the plurality of second word line structures may be formed on the first interlayer insulation layer. The plurality of second word line structures may be arranged to overlap with the plurality of first word line structures, respectively. The second switching functional layer, the first interlayer insulation layer, the first switching functional layer, and the base insulation layer may be selectively etched to form bit line contact holes exposing the substrate, and to leave some portions of the first and second switching functional layers that remain on side surfaces of the plurality of first and second word line structures. A conductive material may be provided in the bit line contact holes to form bit line structures.

BRIEF DESCRIPTION OF THE DRAWINGS

FIGS. 5A to 11A are plan views schematically illustrating a method of manufacturing a semiconductor device according to an embodiment of the present disclosure.

FIGS. 5B to 11B are cross-sectional views taken along a line A-A' of a semiconductor device of FIGS. 5A to 11A.

FIGS. 8C to 11C are cross-sectional views taken along a line B-B' of a semiconductor device of FIGS. 8A to 11A.

DETAILED DESCRIPTION

Figure 1:
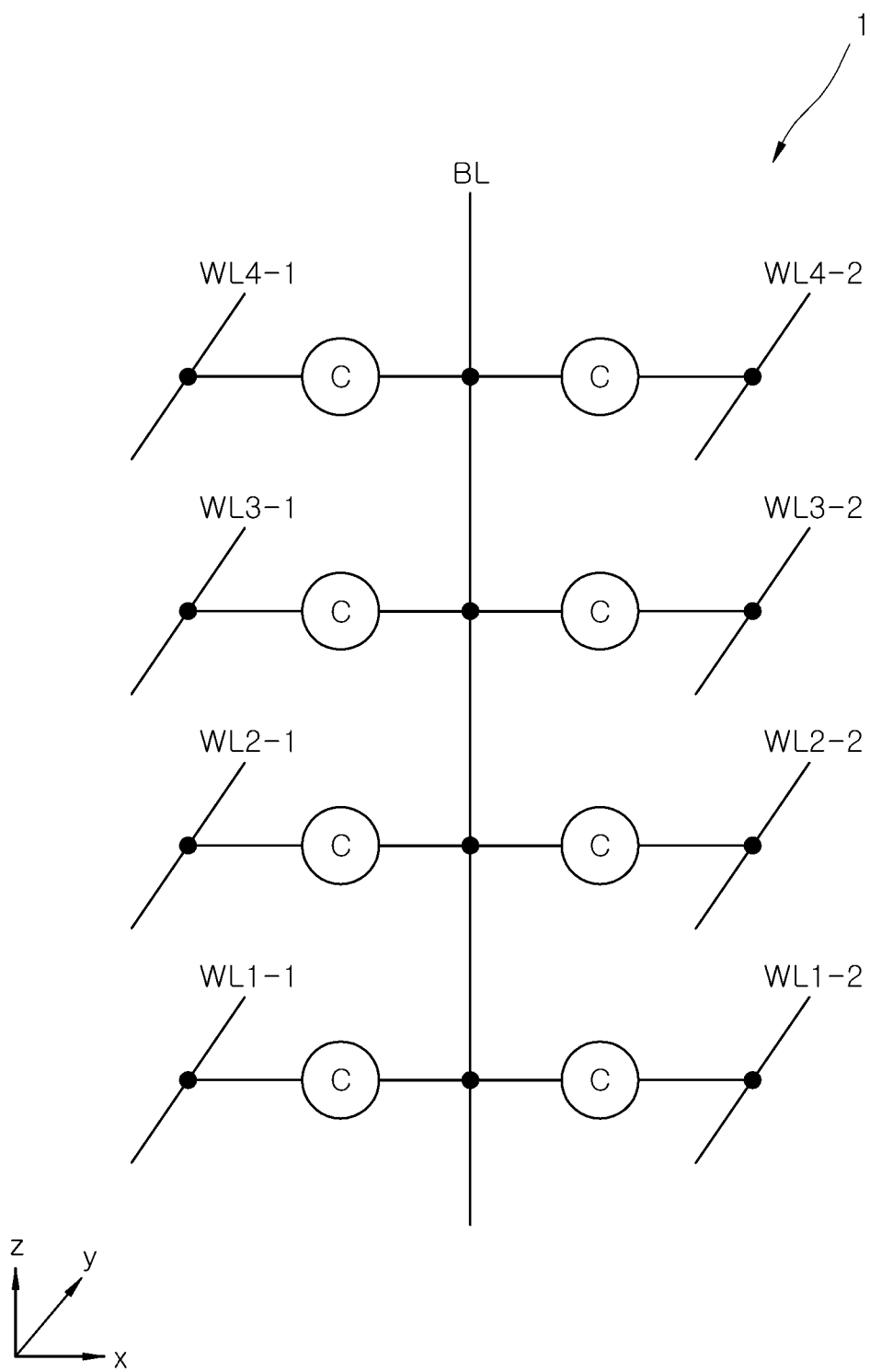
FIG. 1 is a view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time, or may be performed in a different order. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

In this specification, word lines and bit lines may be interpreted as relative concepts. That is, the functions of the word line and the bit line may be determined relatively according to the design of the semiconductor device. Accordingly, the word line may function as a bit line according to the design, and the bit line may function as a word line.

FIG. 1 is a view schematically illustrating a semiconductor device according to an embodiment of the present disclosure. Referring to FIG. 1, a semiconductor device 1 may include a bit line BL extending in a first direction (i.e., z-direction), and a plurality of word lines WL1-1, WL1-2, WL2-1, WL2-2, WL3-1, WL3-2, WL4-1, and WL4-2 extending in a second direction (i.e., y-direction) perpendicular to the first direction. In addition, the semiconductor device 1 may include a plurality of unit cells C arranged in regions where the bit line BL overlaps with the plurality of word lines WL1-1, WL1-2, WL2-1, WL2-2, WL3-1, WL3-2, WL4-1, and WL4-2.

The plurality of word lines WL1-1, WL1-2, WL2-1, WL2-2, WL3-1, WL3-2, WL4-1, and WL4-2 may include first word lines WL1-1 and WL1-2, second word lines WL2-1 and WL2-2, third word lines WL3-1 and WL3-2, and fourth word lines WL4-1 and WL4-2. The plurality of word lines may be arranged along the first direction (i.e., z-direction). In FIG. 1, first to fourth word lines are shown, but the number of word lines is not necessarily limited thereto, and various other numbers are possible.

The first word lines WL1-1 and WL1-2 may be configured as a pair of word lines sharing the bit line BL. Each of the second word lines WL2-1 and WL2-2, the third word lines WL3-1 and WL3-2, and the fourth word lines WL4-1 and WL4-2 may also be configured respectively as pairs of word lines sharing the bit line B in the same manner.

A unit cell C according to embodiments of the present disclosure may have a switching layer performing a threshold switching operation. The switching layer may have a programmable and variable threshold voltage. That is, by performing different program operations to the unit cell C, the switching layer may have different threshold voltages. Subsequently, a read operation is performed to identify a difference between the different threshold voltages, so that signal information programmed in the unit cell C can be read.

Figure 2A:
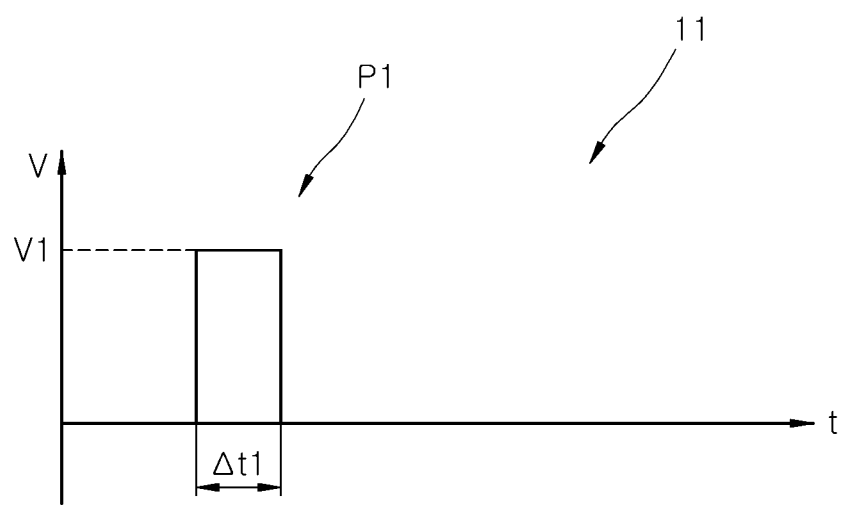
FIG. 2A is a view schematically illustrating a first program operation to a unit cell according to an embodiment of the present disclosure.
Figure 2B:
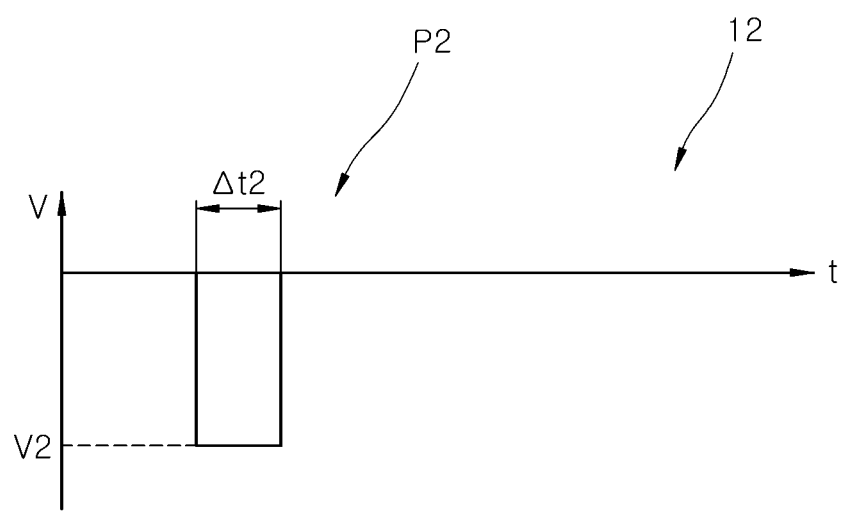
FIG. 2B is a view schematically illustrating a second program operation to a unit cell according to an embodiment of the present disclosure.
Figure 2C:
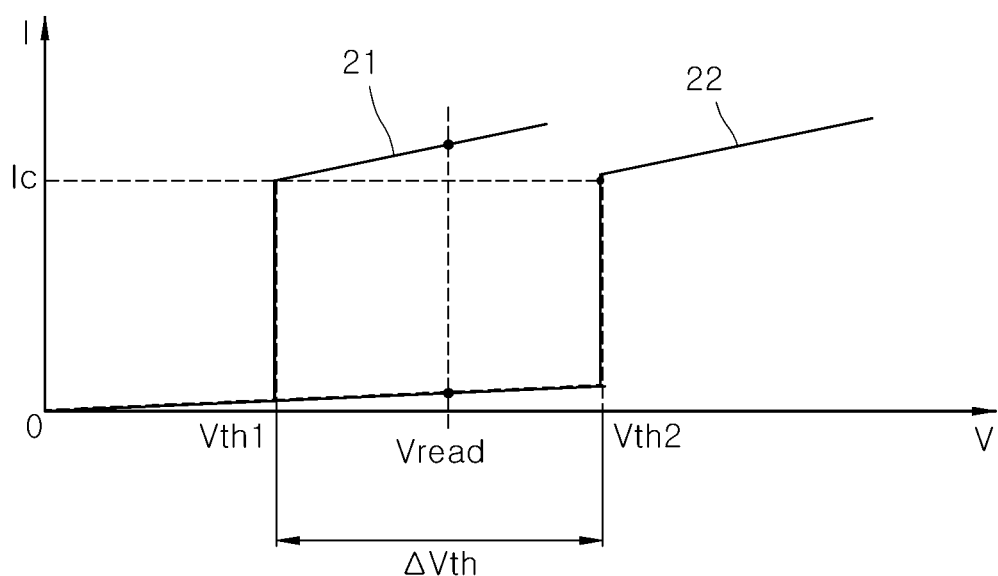
FIG. 2C is a view schematically illustrating a read operation to a unit cell according to an embodiment of the present disclosure.

FIG. 2A is a view schematically illustrating a first program operation to a unit cell according to an embodiment of the present disclosure. FIG. 2B is a view schematically illustrating a second program operation to a unit cell according to an embodiment of the present disclosure. FIG. 2C is a view schematically illustrating a read operation to a unit cell according to an embodiment of the present disclosure. Hereinafter, as an embodiment, in FIG. 1, the first and second program operations and the read operation will be described with respect to a unit cell C disposed between any one of a plurality of word lines WL1-1, WL1-2, WL2-1, WL2-2, WL3-1, WL3-2, WL4-1, and WL4-2 and a bit line BL. For convenience of description, any one of the word lines coupled to the described unit cell C will be referred to as a selected word line.

Referring to FIG. 2A, a first program operation 11 may be performed by applying a first program voltage P1 to the unit cell C.

In an embodiment, the first program voltage P1 may be a positive pulse voltage having a first amplitude V1 during a first time interval $\Delta t1$. In an embodiment, the first program operation 11 may be performed by applying the first program voltage P1 to the selected word line while the bit line BL, in FIG. 1, is grounded. In this case, no voltage may be applied to the word lines other than the selected word line, or a positive pulse voltage having an amplitude smaller than the first amplitude V1 of the first program voltage P1 may be applied to the word lines other than the selected word line.

Referring to FIG. 2B, a second program operation 12 may be performed by applying a second program voltage P2 to the unit cell C. In an embodiment, the second program voltage P2 may be a negative pulse voltage having a second amplitude V2 during a second time interval $\Delta t2$. In an embodiment, in FIG. 1, the second program operation 12 may be performed by applying the second program voltage P2 to the selected word line while the bit line BL is grounded. In this case, no voltage may be applied to the word lines other than the selected word line, or a negative pulse voltage having an amplitude smaller than the second amplitude V2 of the second program voltage P2 may be applied to the word lines other than the selected word line.

Referring to FIG. 2C, a read operation method with respect to the unit cell C to which the first and second program operations 11 and 12 are performed, is described using first and second switching graphs 21 and 22. In FIG. 1, the first and second switching graphs 21 and 22 represent currents output from a selected unit cell C when a voltage is applied to the selected word line while sweeping in a positive direction from 0 V and while the bit line BL is grounded.

Referring to the first and second switching graphs 21 and 22, when the applied voltages reach first and second threshold voltages Vth1 and Vth2, respectively, the currents output from the unit cell C may increase rapidly to reach a turn-on current Ic. As such, when the applied voltages are less than the respective first and second threshold voltages Vth1 and Vth2, relatively low currents may be output from the unit cell C, and when the applied voltages are equal to or greater than the respective first and second threshold voltages Vth1 and Vth2, relatively high currents may be output from the unit cell C. However, when the applied voltages are reduced to 0 V again, the output currents may be reduced to 0 A. In this way, the unit cell C may perform a threshold switching operation along the first and second switching graphs 21 and 22 by the application of the voltages.

In an embodiment, as in FIG. 2A, after performing the first program operation 11 on the unit cell C with a first program voltage P1 having a positive polarity, when applying a voltage having a positive polarity to the unit cell C while sweeping as in FIG. 2C, the unit cell C may perform a threshold switching operation along the first switching graph 21. That is, the unit cell C may have a relatively low first threshold voltage Vth1.

In another embodiment, as in FIG. 2B, after performing the second program operation 12 on the unit cell C with the second program voltage P2, when a voltage having a positive polarity is applied to the unit cell C while sweeping as in FIG. 2C, the unit cell C may perform a threshold switching operation along the second switching graph 22. That is, the unit cell C may have a relatively high second threshold voltage Vth2.

Referring FIG. 2C, the read operation with respect to the unit cell C to which the first program operation 11 or the second program operation 12 has been performed may be performed as follows. First, a voltage between the first threshold voltage Vth1 and the second threshold voltage Vth2 may be determined as a read voltage Vread. The determined read voltage Vread may be applied to the unit cell C and a current output from the unit cell C may be measured. The measured current may be identified as one of a high current and a low current, and thus, signal information stored in the unit cell C may be read. A voltage difference ΔVth between the first threshold voltage Vth1 and the second threshold voltage Vth2 may determine a margin or window of the read voltage.

As described above, when a unit cell C is programmed with a program voltage having the same polarity as that of the read voltage, the unit cell C may have a relatively small threshold voltage during the read operation using the read voltage. Conversely, when the unit cell C is programmed with a program voltage of a polarity different from that of the read voltage, the unit cell C may have a relatively large threshold voltage during the read operation using the read voltage. Accordingly, according to embodiments of the present disclosure, after the polarity of the read voltage is determined, the polarity of a program voltage to be applied for a program operation may be determined based on the determined polarity of the read voltage.

Figure 3A:
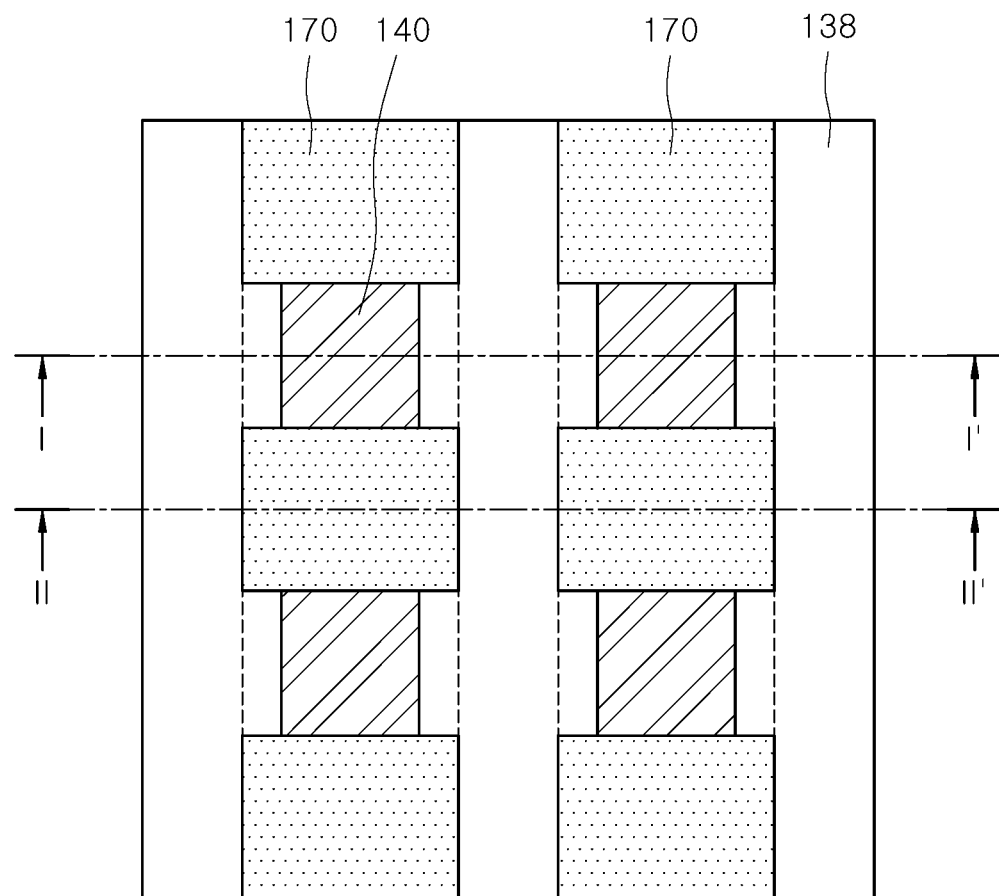
FIG. 3A is a plan view schematically illustrating a semiconductor device according to an embodiment of the present disclosure.
Figure 3B:
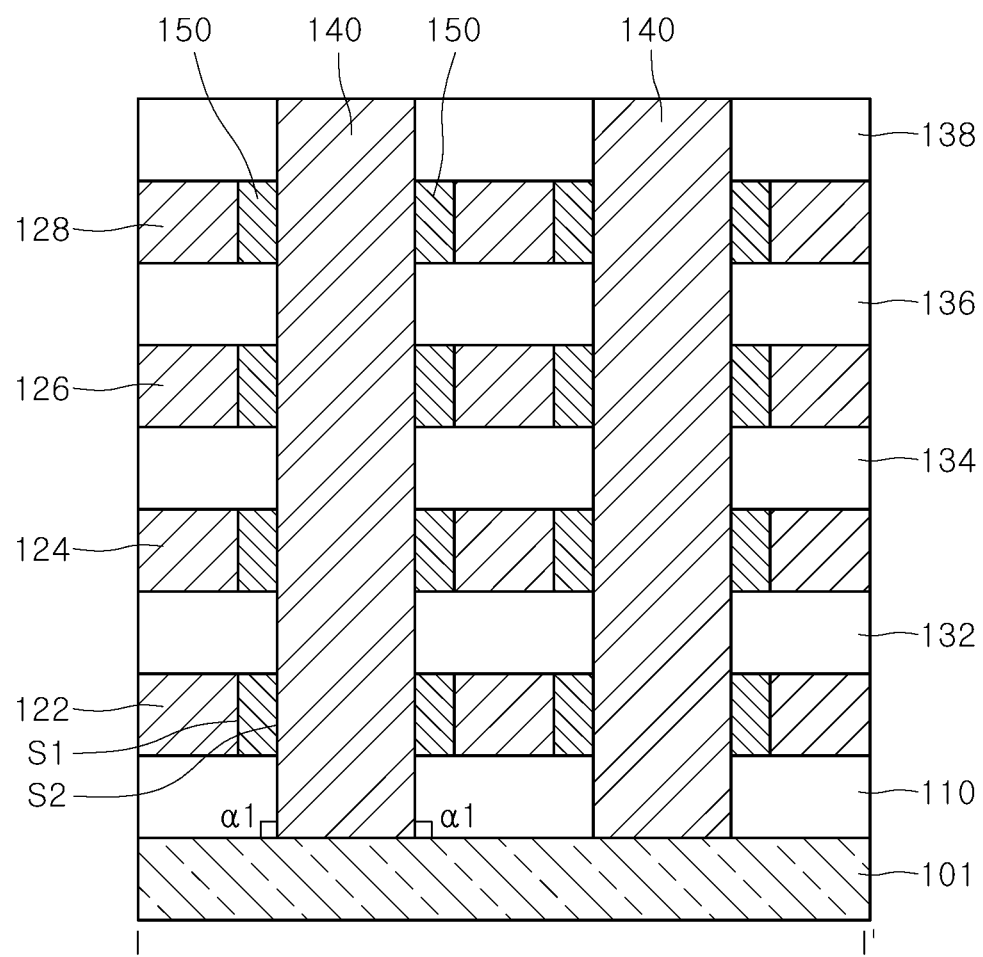
FIG. 3B is a cross-sectional view taken along a line I-I' of a semiconductor device of FIG. 3A.
Figure 3C:
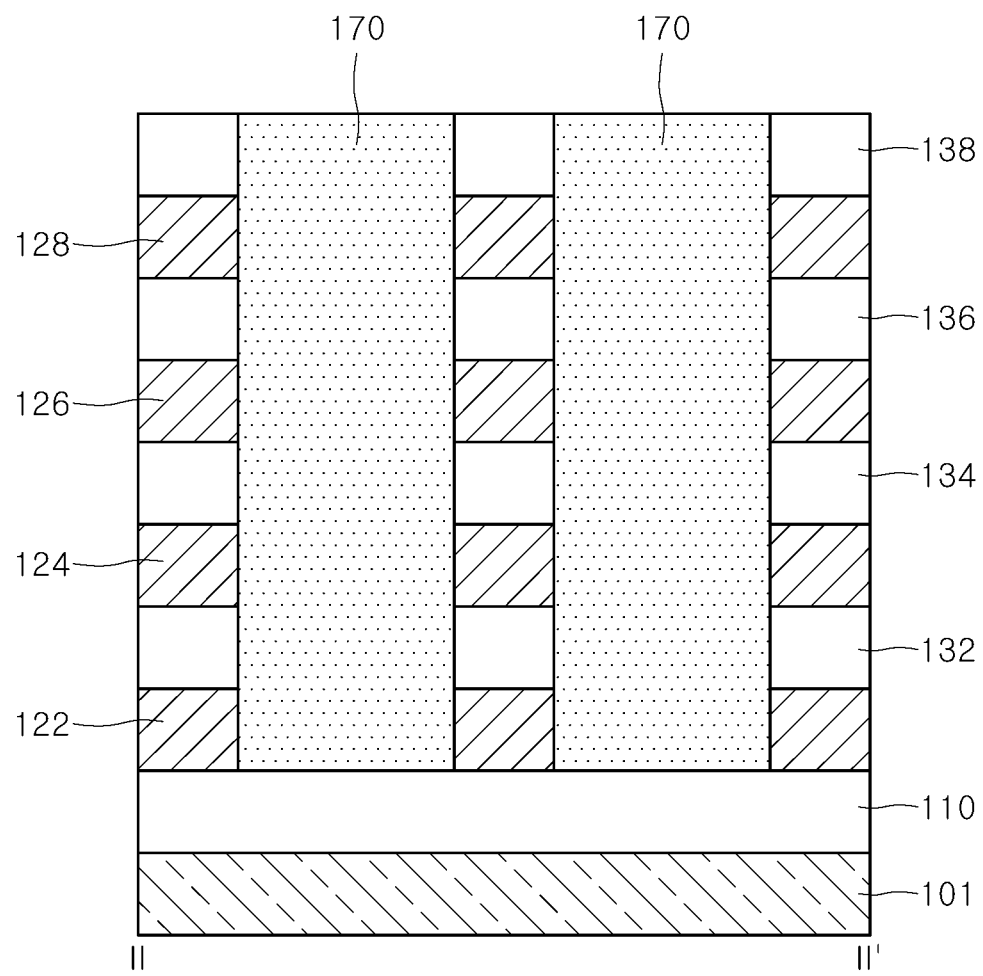
FIG. 3C is a cross-sectional view taken along a line II-II' of a semiconductor device of FIG. 3A.

FIG. 3A is a plan view schematically illustrating a semiconductor device according to an embodiment of the present disclosure. FIG. 3B is a cross-sectional view taken along a line I-I' of a semiconductor device of FIG. 3A. FIG. 3C is a cross-sectional view taken along a line II-II' of a semiconductor device of FIG. 3A.

Referring to FIGS. 3A, 3B, and 3C, a semiconductor 1a may include a substrate 101, a plurality of word line structures 122, 124, 126, and 128 disposed on or over the substrate 101, and switching layers 150. In addition, the semiconductor device 1a may include bit line structures 140 adjacent to surfaces of the switching layers 150 over the substrate 101. The switching layers 150 may be arranged between the plurality of word line structures 122, 124, 126, and 128 and the bit line structures 140 to constitute a plurality of unit cells.

The substrate 101 may be made of or include a semiconductor material. The semiconductor material may include, for example, silicon (Si), germanium (Ge), gallium arsenide (GaAs), molybdenum selenide (MoSe2), hafnium selenide (HfSe2), indium selenide (InSe), gallium selenide (GaSe), black phosphorous, indium-gallium-zinc oxide (IGZO), or a combination of two or more thereof. The semiconductor material may, for example, be doped with an n-type or p-type dopant. In some other embodiments, the substrate 101 may be an insulation substrate or a conductive substrate.

A base insulation layer 110 may be disposed on the substrate 101. The base insulation layer 110 may electrically insulate a lowermost word line structure 122, of the plurality of word line structures 122, 124, 126, and 128, from the substrate 101. The base insulation layer 110 may be made of or include an insulation material. The insulation material may include, for example, oxide, nitride, oxynitride, or a combination of two or more thereof.

Although not illustrated, an integrated circuit may be disposed between the substrate 101 and the base insulation layer 110. The integrated circuit may include, for example, an active device such as a transistor, a passive device such as a resistor and a capacitor, or a combination of active devices and passive devices. The integrated circuit may include at least one circuit pattern layer and at least one insulation layer for insulating the at least one circuit pattern layer.

Referring to FIGS. 3B and 3C, the first word line structure 122 may be disposed on the base insulation layer 110. The first word line structure 122 may extend in a second direction (i.e., y-direction) parallel to a top or bottom surface (i.e., x-y plane) of the substrate 101. The first word line structure 122 may be disposed to be spaced apart from another first word line structure in a third direction (i.e., x-direction), which is perpendicular to the second direction.

A second word line structure 124 may be disposed over the first word line structure 122. The second word line structure 124 may extend in the second direction (i.e., y-direction). The second word line structure 124 may be disposed to be spaced apart form another second word line structure in the third direction (i.e., x-direction). The second word line structure 124 may be disposed to be parallel with the first word line structure 122 on different parallel planes.

The second word line structure 124 and the first word line structure 122 may be disposed to overlap with each other on different planes. A first interlayer insulation layer 132 may be disposed between the first word line structure 122 and the second word line structure 124. The first interlayer insulation layer 132 may electrically insulate the first word line structure 122 and the second word line structure 124.

In substantially the same way, a second interlayer insulation layer 134, a third word line structure 126, a third interlayer insulation layer 136, a fourth word line structure 128, and a fourth interlayer insulation layer 138 may be sequentially disposed over the base insulation layer 110.

The first to fourth word line structures 122, 124, 126, and 128 may be made of or include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, gallium arsenide (GaAs), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The first to fourth interlayer insulation layers 132, 134, 136, and 138 may be made of or include an insulation material. The insulation material may include, for example, oxide, nitride, oxynitride, or a combination of two or more thereof.

In some embodiments, when the interlayer insulation layers and the word line structures are alternately stacked along the first direction (i.e., z-direction), the number of the stacked interlayer insulation layers and the number of the stacked word line structures might not necessarily be limited to the number shown in FIGS. 3A, 3B, and 3C, and numbers of these structures and layers may vary.

Each of the switching layers 150 may be disposed to be adjacent to side surface S1 of each of the first to fourth word line structures 122, 124, 126, and 128, respectively. Each of the switching layers 150 may be separated in the second direction (i.e., y-direction) by a cell insulation structure 170. A surface S2 of each of the switching layers 150 may contact the bit line structures 140.

The switching layer 150 may be made of or include, for example, a chalcogenide-based material. The switching layer 150 may be made of or include, for example, germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), Tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt), or a combination of two or more thereof.

A switching layer 150 may perform the threshold switching operations described above with reference to FIGS. 2A to 2C by a voltage applied to both ends of the switching layer 150. The switching layer 150 may have a programmable and variable threshold voltage. In an embodiment, the switching layer 150 may function as a memory layer using the variable threshold voltage characteristic inside the unit cell.

Referring to FIGS. 3A, 3B, and 3C, the bit line structures 140 may be disposed over the substrate 101 to extend in the first direction (i.e., z-direction) and contact a surface S2 of each of the switching layers 150. As shown in FIG. 3A, the bit line structure 140 may be disposed to be spaced apart from other neighboring bit line structures in the second direction (i.e., y-direction) by the cell insulation structure 170.

Each of the bit line structures 140 may be disposed to contact the substrate 101. Each of the bit line structures 140 may be electrically connected to an integrated circuit inside the substrate 101.

Referring to FIG. 3B, one side surface of each of the bit line structures 140 in contact with the switching layer 150 and the first to fourth interlayer insulation layers 132, 134, 136, and 138 may have an inclination angle α1, which may be substantially perpendicular to the surface of the substrate 101.

The bit line structure 140 may be made of or include a conductive material. The conductive material may include, for example, silicon (Si) doped with an n-type or p-type dopant, gallium arsenide (GaAs), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The cell insulation structures 170 may be disposed over the base insulation layer 110 to extend in the first direction (i.e., z-direction). A cell insulation layer 170 may be disposed to contact switching layers 150, the first to fourth interlayer insulation layers 132, 134, 136, and 138, and a bit line structure 140 in the second direction (i.e., y-direction). The cell insulation layer 170 may be disposed to contact the first to fourth word line structures 122, 124, 126, and 128, and the first to fourth interlayer insulation layers 132, 134, 136, and 138 in the third direction (i.e., x-direction).

Although not illustrated, in some embodiments, a polymer layer including carbon (C) may be disposed at an interface between a switching layer 150 and a bit line structure 140. The polymer layer may function as a buffer layer between the switching layer 150 and the bit line structure 140. The polymer layer may be formed in a process of forming the switching layer 150. The process of generating the polymer layer through a patterning process for switching functional layers 352, 354, 356, and 358 will be described below in detail in relation to to FIGS. 10A, 10B, and 10C.

The polymer layer may be connected to the switching layer 150 in series between the first to fourth word line structures 122, 124, 126, and 128, respectively, and the bit line structure 140. The polymer layer may function as a resistor layer having a constant electrical resistance. The polymer layer can prevent an output current from rapidly increasing at a threshold voltage during a threshold switching operation of the switching layer 150. That is, the polymer layer can prevent an excessive bias or excessive current from being applied to or flowing through the switching layer 150 during the threshold switching operation, thereby preventing a decrease in durability of the semiconductor device.

In addition, the polymer layer can help to gradually increase an output current according to an increase in an applied voltage during the threshold switching operation of the switching layer 150. As a result, the range of the program operation (i.e., the operation window) can be increased by increasing the voltage range capable of driving the switching layer 150.

Figure 4:
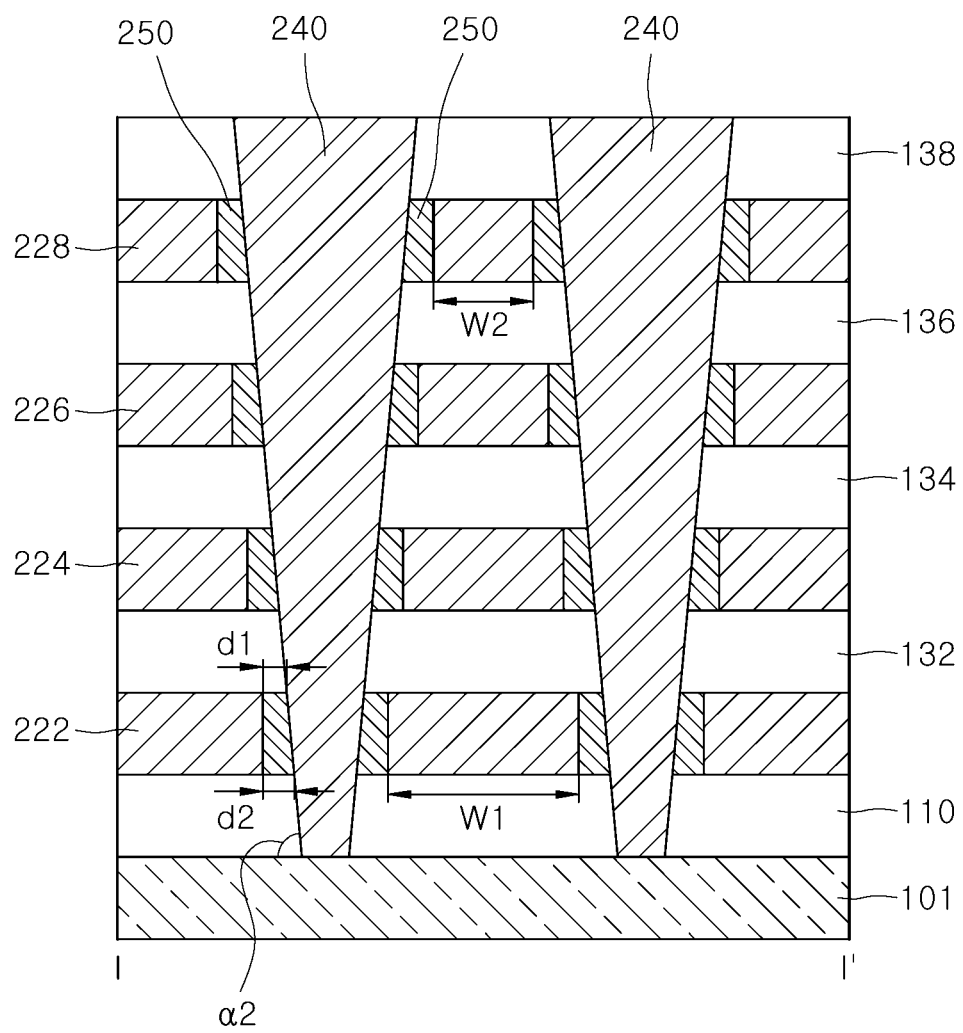
FIG. 4 is a cross-sectional view schematically illustrating a semiconductor device according to another embodiment of the present disclosure.

FIG. 4 is a cross-sectional view schematically illustrating a semiconductor device according to another embodiment of the present disclosure. Referring to FIG. 4, a semiconductor device 1b may be different from the semiconductor device 1a, described above with reference to FIGS. 3A, 3B, and 3C, in an inclination angle α2 formed by one side of a bit line structure 240 with a surface of a substrate 101.

The cross-sectional view of FIG. 4 may correspond to the cross-sectional view of FIG. 3B. The semiconductor device 1b may include first to fourth word line structures 222, 224, 226, and 228 disposed to be spaced apart from each other in the first direction (i.e., z-direction). The first to fourth word line structures 222, 224, 226, and 228 may be made of substantially the same material as the first to fourth word line structures 122, 124, 126, and 128 of the semiconductor device 1a.

The semiconductor device 1b may include bit line structures 240 extending in a first direction (i.e., z-direction). The inclination angle α2 is formed by a side surface of each of the bit line structures 240 with a substrate 101. A side surface of each of the bit line structures 240 may also be in contact with switching layers 250 and the first to fourth interlayer insulation layers 132, 134, 136, and 138. The inclination angle α2 may be an acute angle. The bit line structures 240 may be made of substantially the same material as the bit line structures 140 of the semiconductor device 1a.

Referring to FIG. 4, in the each of bit line structures 240, the area of a cross-section (i.e., a section made by plane parallel to the x-y plane) perpendicular to the first direction (i.e., z-direction) may change along the first direction (i.e., z-direction). As an example, the area of the cross-section of a lower portion of each of the bit line structures 240 may be smaller than the area of the cross-section of an upper portion of each of the bit line structures 240.

In an embodiment, each of the first to fourth word line structures 222, 224, 226, and 228 may have different widths in the third direction (i.e., the x-direction). In an embodiment, the widths in the third direction may be sequentially decreased from the first word line structure 222 to the fourth word line structure 228. As an example, a width W1 of the first word line structure 222 in the third direction may be the largest, and a width W2 of the fourth word line structure 228 in the third direction may be the smallest.

In an embodiment, a distance along the third direction (i.e., the x-direction) between the first word line structure 222 and the adjacent bit line structure 240 may vary between a minimum distance d1 and a maximum distance d2. The minimum distance d1 may be obtained at an interface between the first word line structure 222 and the first interlayer insulation layer 132. The maximum distance d2 may be obtained at an interface between the first word line structure 222 and the base insulation layer 110.

In addition, a distance along the third direction (i.e., x-direction) between each of the second to fourth word line structures 224, 226, and 228 and the adjacent bit line structure 240 may be substantially the same as a distance along the third direction (i.e., x-direction) between the first word line structure 222 and the adjacent bit line structure 240. As an example, a distance along the third direction (i.e., x-direction) between each of the second to fourth word line structures 224, 226, and 228 and the adjacent bit line structures 240 may vary between the minimum distance d1 and the maximum distance d2. The minimum distance d1 may be obtained at the upper surfaces of each of the second to fourth word line structures 224, 226, and 228, and the maximum distance d2 may be obtained from at lower surfaces of the second to fourth word line structures 224, 226, and 228, respectively.

Referring to FIG. 4, the switching layers 250 may be disposed between each of the first to fourth word line structures 222, 224, 226, and 228 and the bit line structures 240. Each of the switching layers 250 may have a thickness that varies, in the third direction (i.e., x-direction), from a minimum thickness d1 to a maximum thickness d2 as measured from a side surface of each of the first to fourth word line structures 222, 224, 226, and 228. The switching layer 250 may be made of substantially the same material as the switching layer 150 described above with reference to FIGS. 3A, 3B, and 3C.

FIGS. 5A to 11A are plan views schematically illustrating a method of manufacturing a semiconductor device according to an embodiment of the present disclosure. FIGS. 5B to 11B are cross-sectional views taken along a line A-A' of a semiconductor device of FIGS. 5A to 11A. FIGS. 8C to 11C are cross-sectional views taken along a line B-B' of a semiconductor device of FIGS. 8A to 11A.

Figure 5A:
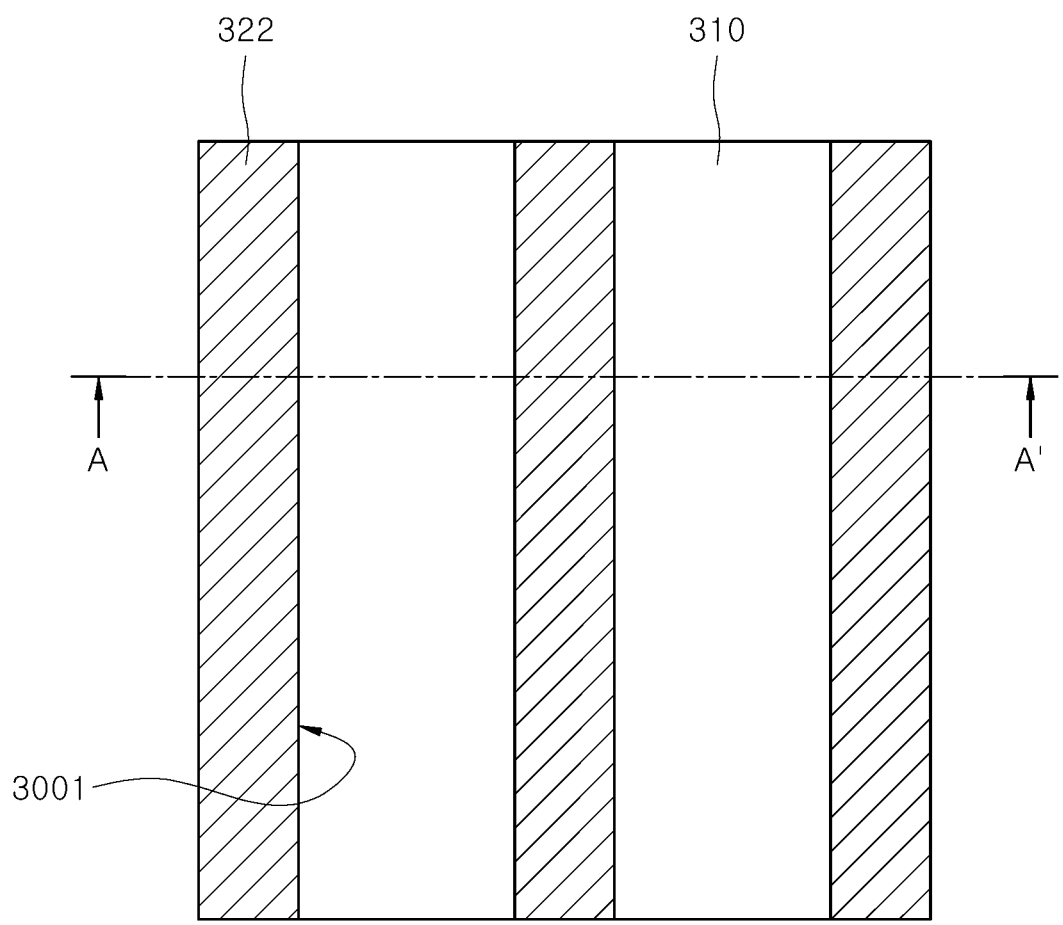
Figure 5B:
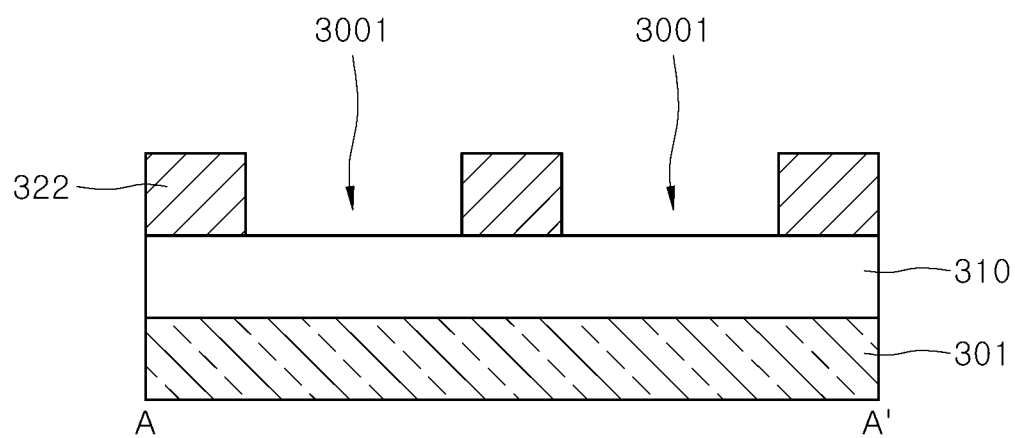

Referring to FIGS. 5A and 5B, a substrate 301 may be provided. The substrate 301 may be substantially the same as a substrate 101 described above with reference to FIGS. 3A, 3B, and 3C.

Next, a base insulation layer 310 may be formed on the substrate 301. The base insulation layer 310 may be formed using, for example, a chemical vapor deposition method, a physical vapor deposition method, an atomic layer deposition method, and the like.

Although not illustrated, an integrated circuit may be formed between the substrate 301 and the base insulation layer 310. The integrated circuit may include, for example, an active device such as a transistor, a passive device such as a resistor and a capacitor, or a combination of active devices and passive devices. The integrated circuit may include at least one circuit pattern layer and at least one insulation layer for insulating the at least one circuit pattern layer.

Next, a conductive material layer may be formed on the base insulation layer 310. The conductive material layer may be patterned to form a plurality of first word line structures 322 extending in a first lateral direction (i.e., y-direction) on the base insulation layer 310. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, gallium arsenide (GaAs), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. A method of forming the conductive material layer may include, for example, a chemical vapor deposition method, a physical vapor deposition method, an atomic layer deposition method, and the like. A lithography method and an etching method may be applied as a method of patterning the conductive material layer.

Referring to FIGS. 5A and 5B, each of the plurality of first word line structures 322 may be disposed to be spaced apart from each other in a second lateral direction (i.e., x-direction) perpendicular to a first lateral direction. Trenches 3001 may be formed in spaces between the plurality of first word line structures 322 in the second lateral direction (i.e., x-direction). Trenches 3001 may extend in the first lateral direction (i.e., y-direction).

Figure 6A:
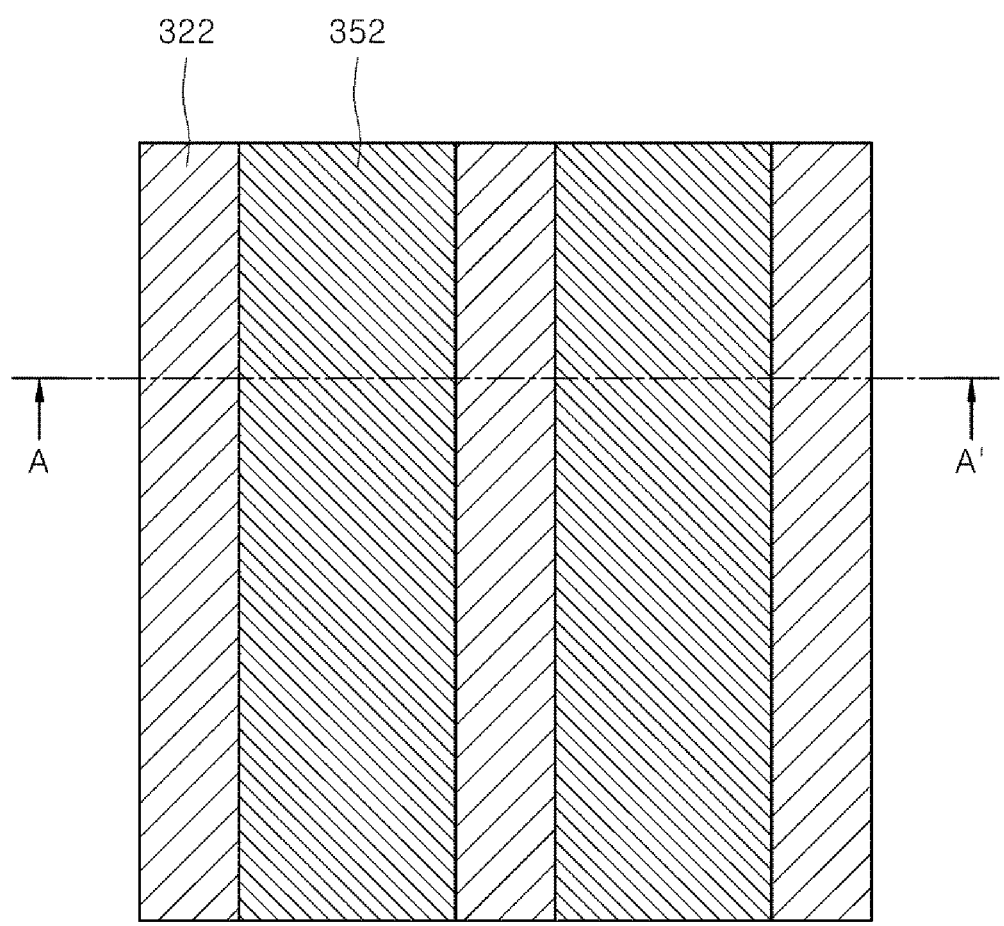
Figure 6B:
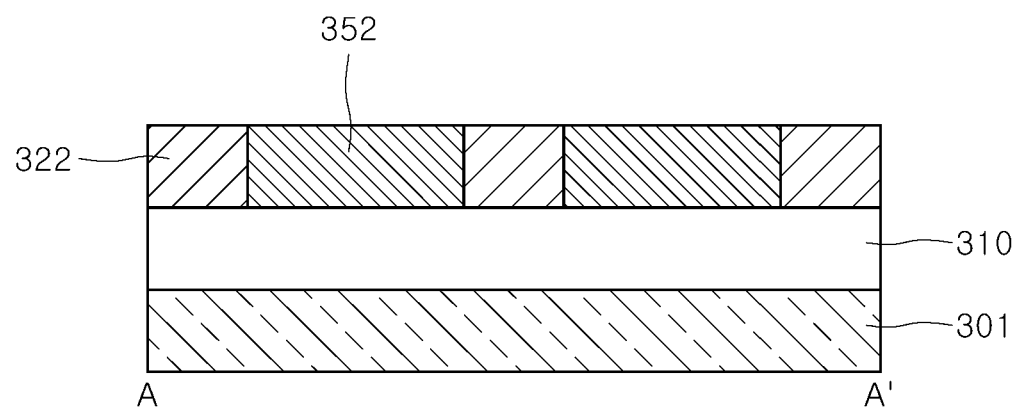

Referring to FIGS. 6A and 6B, a switching material layer may be formed over the base insulation layer 310 to fill the trenches 3001 of FIGS. 5A and 5B with a switching material using a sputtering method. In this case, the switching material layer may also be formed on the plurality of first word line structures 322 outside the trenches 3001. Subsequently, the switching material layer may be planarized over the base insulation layer 310 to form a first switching functional layer 352. The first switching functional layer 352 may be positioned at the same level as the plurality of first word line structures 322 on the base insulation layer 310. That is, the first switching functional layer 352 may have the same thickness as each of the plurality of first word line structures 322 on the base insulation layer 310.

The switching material layer may be formed of or include, the switching material such as a chalcogenide-based material. The switching material layer may be formed of or include, for example, germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), Tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt), or a combination of two or more thereof.

The switching material layer may be formed by a sputtering method, for example. In an embodiment of the present disclosure, the sputtering method may be performed by processes including a process of preparing at least one metal target made of metal constituting the switching material layer, and a process of striking the at least one metal target using plasma of an inert gas. The switching material layer may be formed by attaching the metal escaped from the at least one metal target on the substrate by hitting against the at least one metal target. The inert gas may include helium (He), nitrogen ($N_2$), argon (Ar), and the like.

In an embodiment, the at least one metal target may be made of a single metal constituting the switching material layer. The number of the at least one metal target may correspond to the number of the metals constituting the switching material layer. In another embodiment, the at least one metal target may be made of an alloy of a plurality of metals constituting the switching material layer.

In some embodiments, during the sputtering process, a reactive gas may be additionally provided to form the switching material layer. The reactive gas may include, for example, oxygen gas ($O_2$).

The switching material layer may be planarized to form the first switching functional layer 352 by, for example, applying a chemical mechanical polishing process or an etch back process. As a result of the planarization, as illustrated in FIGS. 6A and 6B, an upper surface of the first switching functional layer 352 and the upper surfaces of the plurality of word line structures 322 may be positioned on the same plane.

Figure 7A:
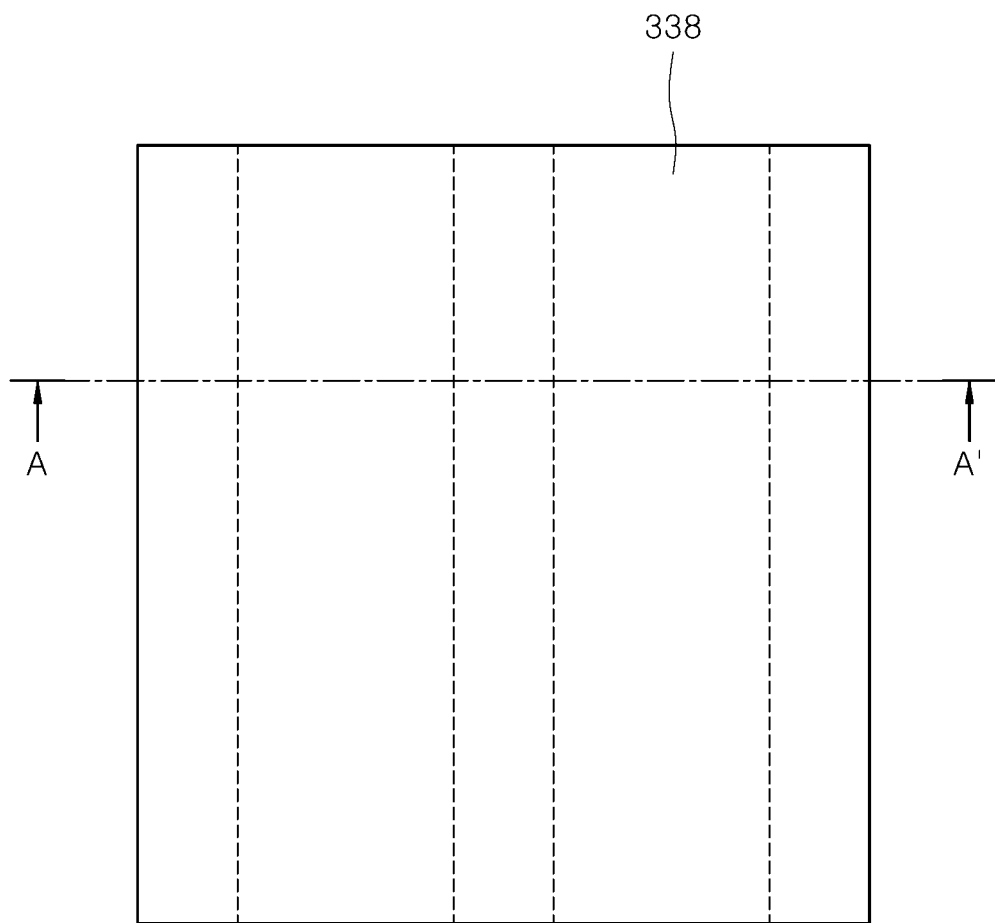
Figure 7B:
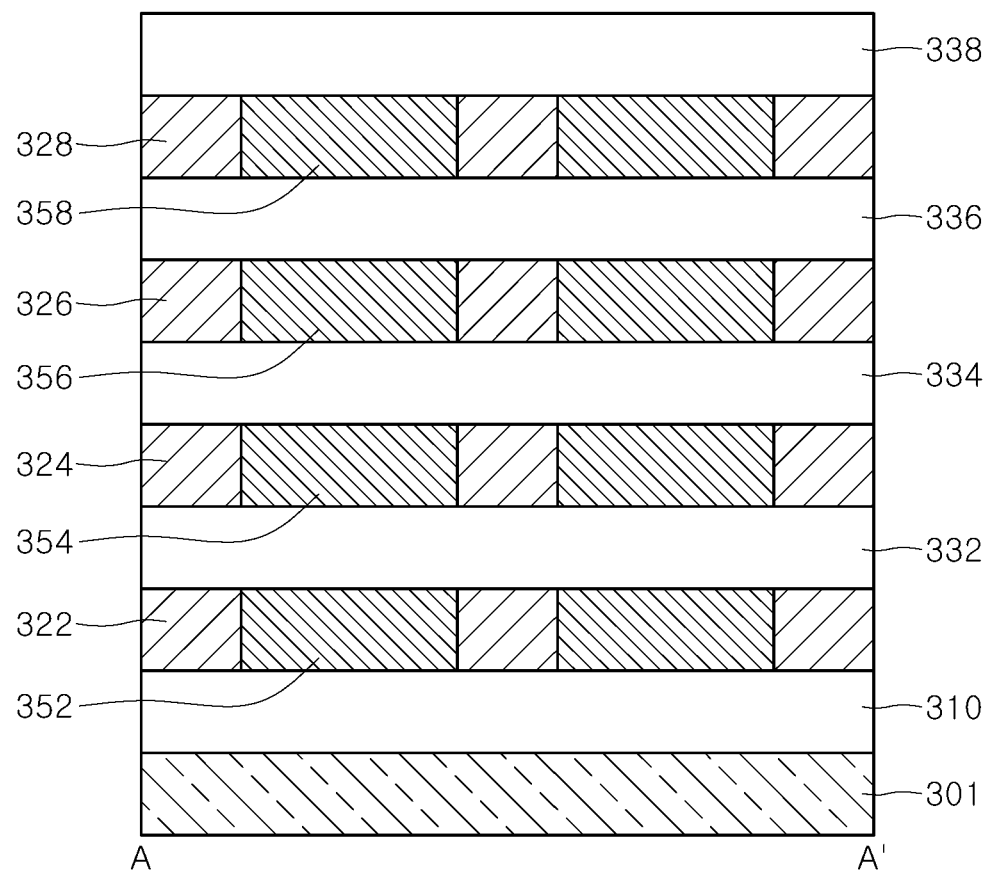

Referring to FIGS. 7A and 7B, a first interlayer insulation layer 332 may be formed on the plurality of word line structures 322 and the first switching functional layer 352. The first interlayer insulation layer 332 may be formed of or include an insulation material. The insulation material may include, for example, oxide, nitride, oxynitride, or a combination of two or more thereof. The first interlayer insulation layer 332 may be formed, for example, using a physical vapor deposition method, a chemical vapor deposition method, and the like.

Next, a plurality of second word line structures 324 extending in the first lateral direction (i.e., y-direction) may be formed on the first interlayer insulation layer 332. The plurality of second word line structures 324 may be formed and arranged to overlap with the plurality of first word line structures 322 in the vertical direction (i.e., the z-direction).

The plurality of second word line structures 324 may have substantially the same configuration as the plurality of first word line structures 322. In addition, the method of forming the plurality of second word line structures 324 may be substantially the same as the method of forming the plurality of first word line structures 322.

Next, a second switching functional layer 354 may be formed between the plurality of second word line structures 324. The second switching functional layer 354 may have substantially the same configuration as the first switching functional layer 352. In addition, the method of forming the second switching functional layer 354 may be substantially the same as the method of forming the first switching functional layer 352.

Next, a second interlayer insulation layer 334, a plurality of third word line structures 326 and a third switching functional layer 356, a third interlayer insulation layer 336, a plurality of fourth word line structures 328 and a fourth switching functional layer 358, and a fourth interlayer insulation layer 338 may be sequentially formed over the plurality of second word line structures 324 and the second switching functional layer 354.

Configurations and forming methods of the plurality of third word line structures 326 and the plurality of fourth word line structures 328 may be substantially the same as the configuration and forming method of the plurality of first word line structures 322 and the plurality of second word line structures 324. Configurations and forming methods of the third switching functional layer 356 and the fourth switching functional layer 358 may be substantially the same as the configuration and forming method of the first switching functional layer 352 and the second switching functional layer 354.

Configurations and forming methods of the second interlayer insulation layer 334, the third interlayer insulation layer 336, and the fourth interlayer insulation layer 338 may be substantially the same as the configuration and forming method of the first interlayer insulation layer 332.

According to an embodiment of the present disclosure, as described above, in the process of forming the first to fourth switching functional layers 352, 354, 356, and 358 from the switching material layers, chemical etching with respect to the switching material layers can be effectively excluded. Accordingly, it is possible to prevent the first to fourth switching functional layers 352, 354, 356, and 358 from being damaged by a chemical etching process. The damage from a chemical etching process may mean, for example, the loss of some of the metal atoms constituting the first to fourth switching functional layers 352, 354, 356, and 358. When the switching material layer contains different types of metal atoms, the different types of metal atoms may be lost in different amounts depending on an etching selectivity with respect to an etchant during chemical etching of a switching material layer. Accordingly, after a chemical etching process is completed, a stoichiometric ratio between the metal atoms constituting the first to fourth switching functional layers 352, 354, 356, and 358 may be changed, so that physical properties of the first to fourth switching functional layers 352, 354, 356, and 358 may be changed. On the contrary, to prevent the loss of metal atoms, according to embodiments of the present disclosure in which the chemical etching is effectively excluded, when the first to fourth switching functional layers 352, 354, 356, and 358 are formed from the switching material layers, undesired changes in physical properties can be prevented. Accordingly, the electrical reliability of the first to fourth switching functional layers 352, 354, 356, and 358 can be improved. As an example of an improvement, the interface characteristics between the plurality of first to fourth word line structures 322, 324, 326, and 328 and the first to fourth switching functional layers 352, 354, 356, and 358 can be stabilized.

Figure 8A:
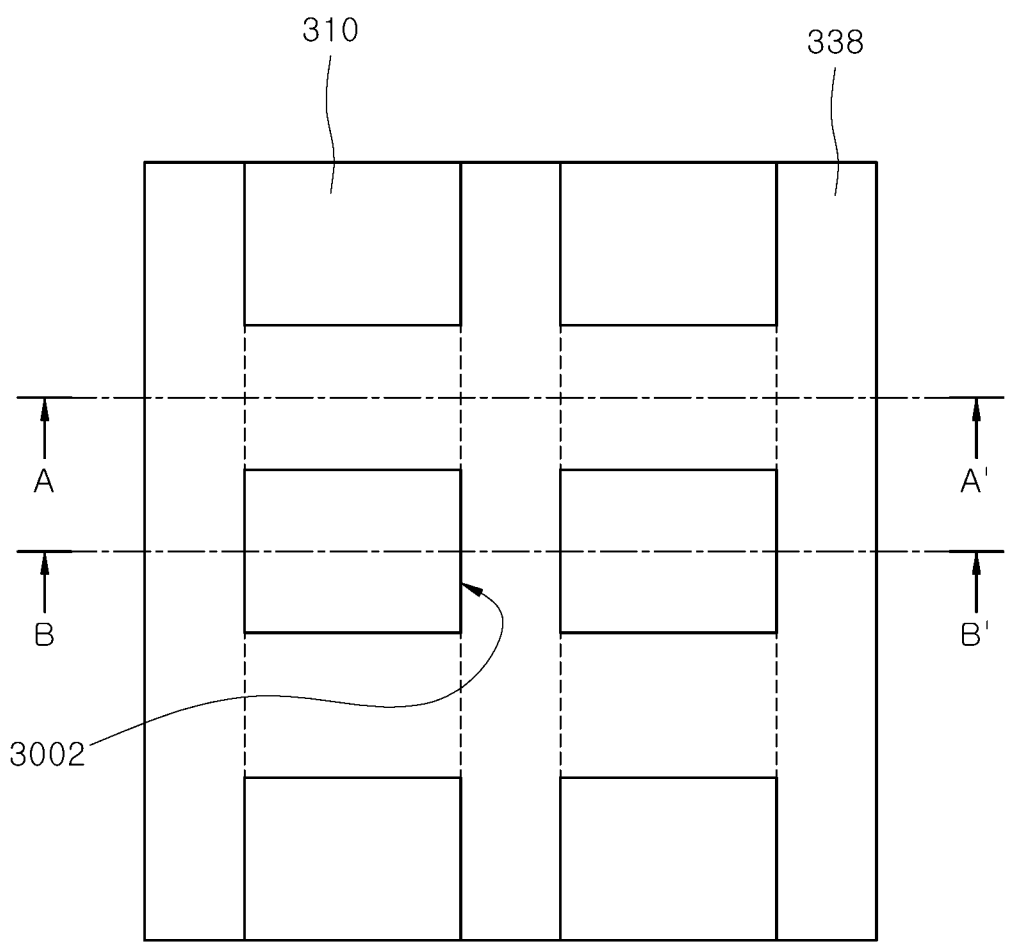
Figure 8B:
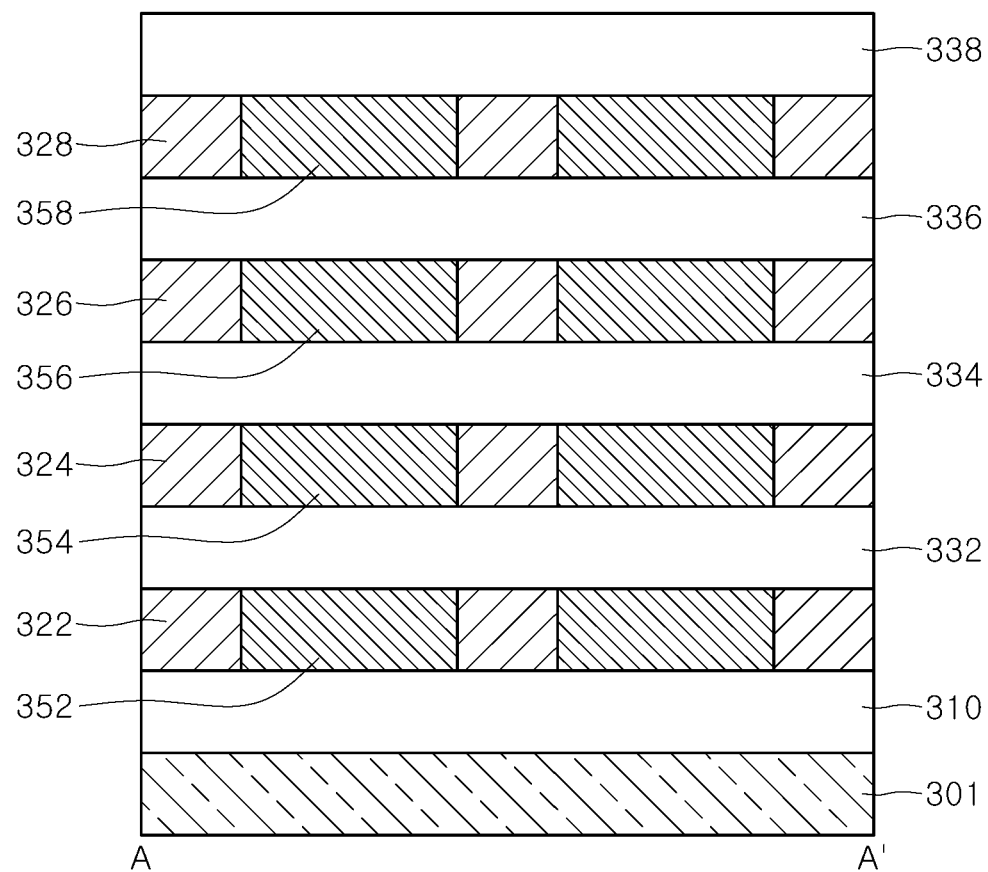
Figure 8C:
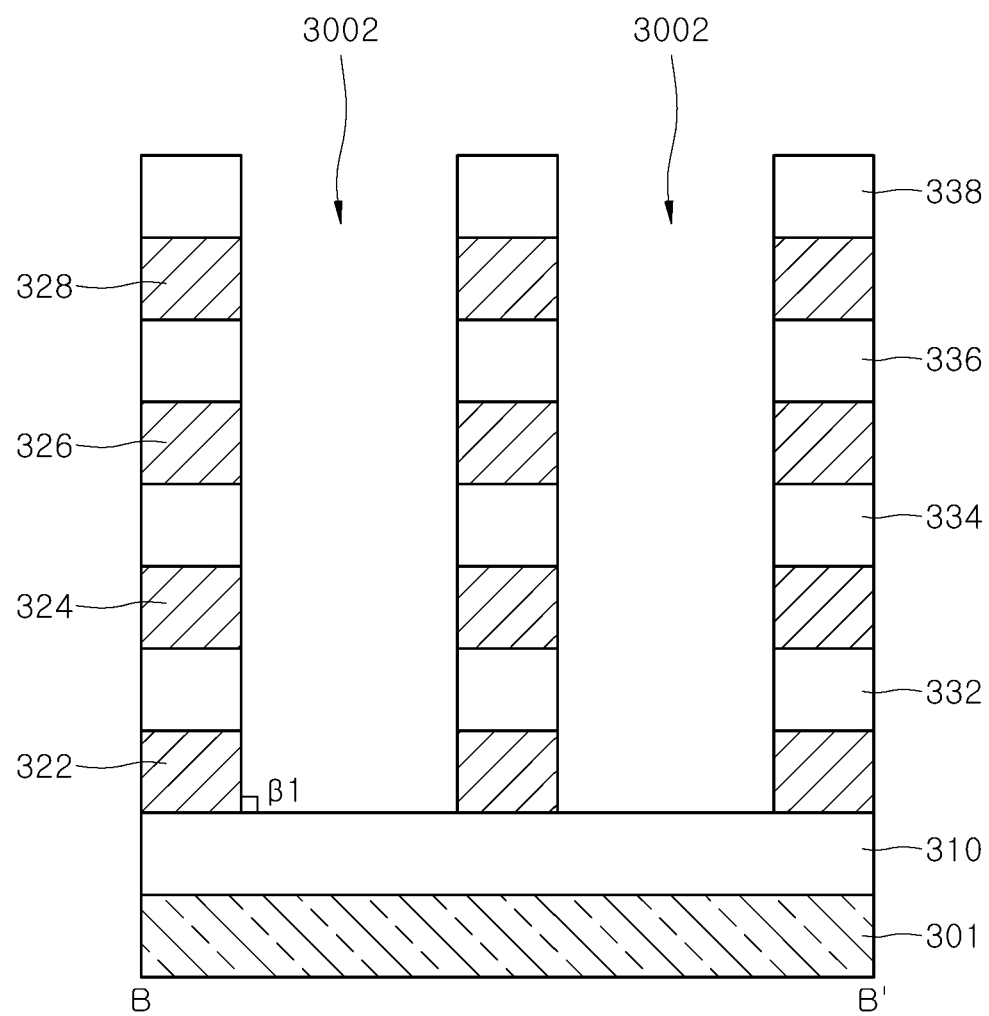

Referring to FIGS. 8A, 8B, and 8C, the first to fourth interlayer insulation layers 332, 334, 336, and 338 and the first to fourth switching functional layers 352, 354, 356, and 358 may be selectively etched to form cell insulation contact holes 3002 exposing the base insulation layer 310. A side surface of each of the cell insulation contact holes 3002 may have an inclination angle β1, which may be substantially perpendicular to the surface of the base insulation layer 310. The cell insulation contact holes 3002 may be formed by applying a lithography method and an anisotropic etching method.

The cell insulation contact holes 3002 may expose the first to fourth switching functional layers 352, 354, 356, and 358 and the first to fourth interlayer insulation layers 332, 334, 336, and 338 in the first lateral direction (i.e., y-direction). The cell insulation contact holes 3002 may expose the first to fourth word line structures 322, 324, 326, and 328 and the first to fourth interlayer insulation layers 332, 334, 336, and 338 in the second lateral direction (i.e., x-direction).

Figure 9A:
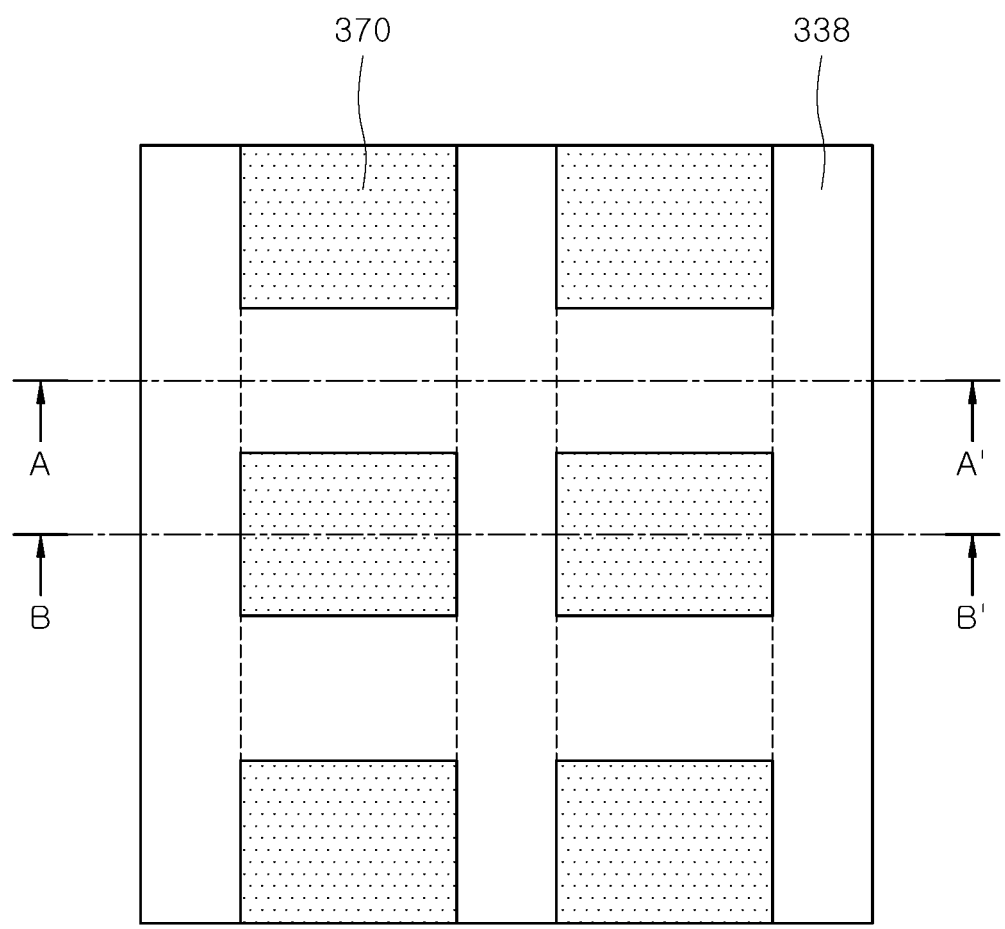
Figure 9B:
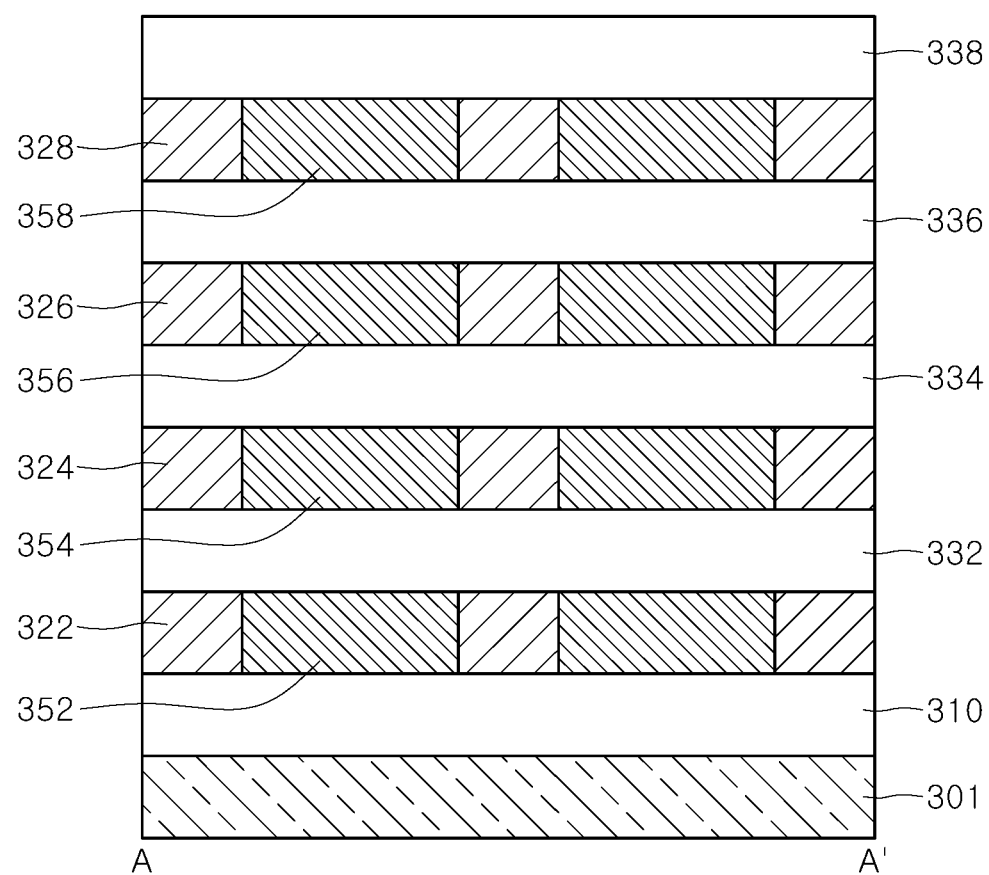
Figure 9C:
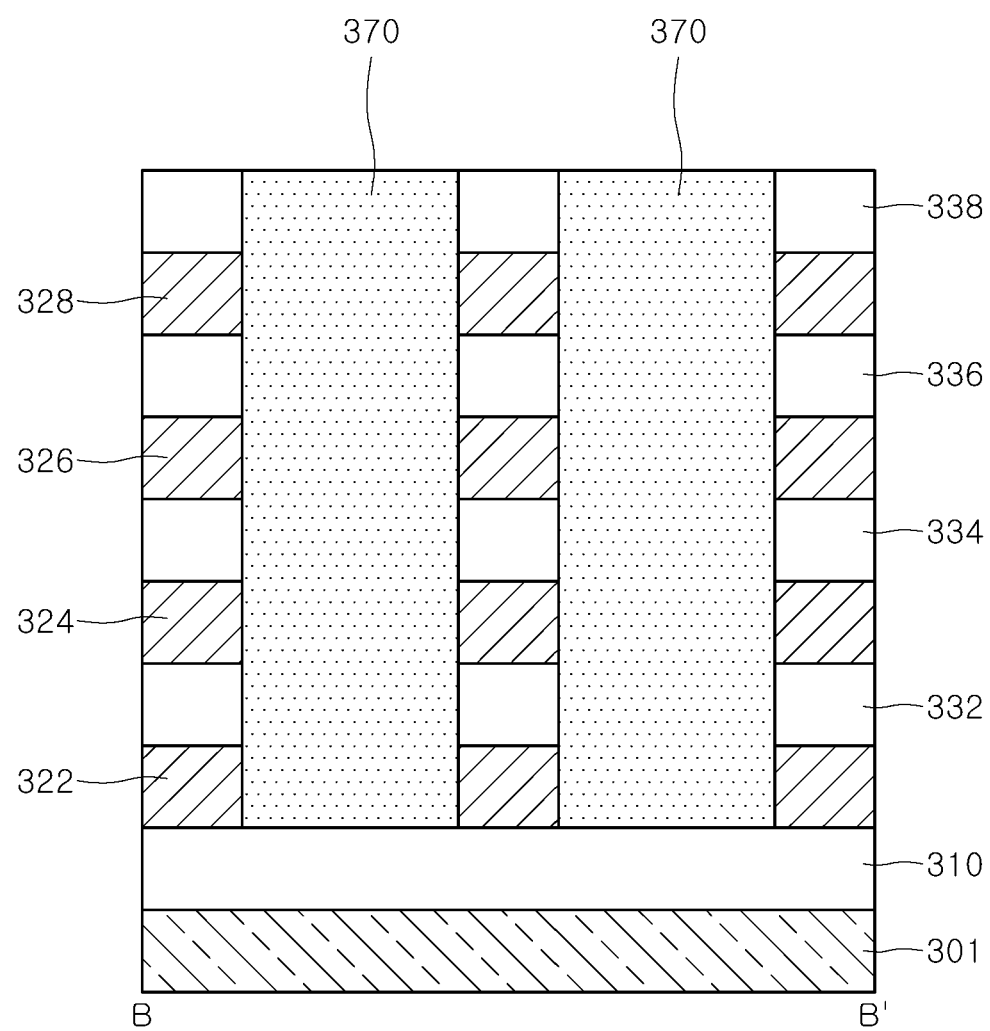

Referring to FIGS. 9A, 9B, and 9C, the cell insulation contact holes 3002 may be filled with an insulation material to form cell insulation structures 370. The insulation material may include, for example, oxide, nitride, oxynitride, or a combination of two or more thereof. The cell insulation structures 370 may be formed by applying a physical vapor deposition method or a chemical vapor deposition method, for example.

Figure 10A:
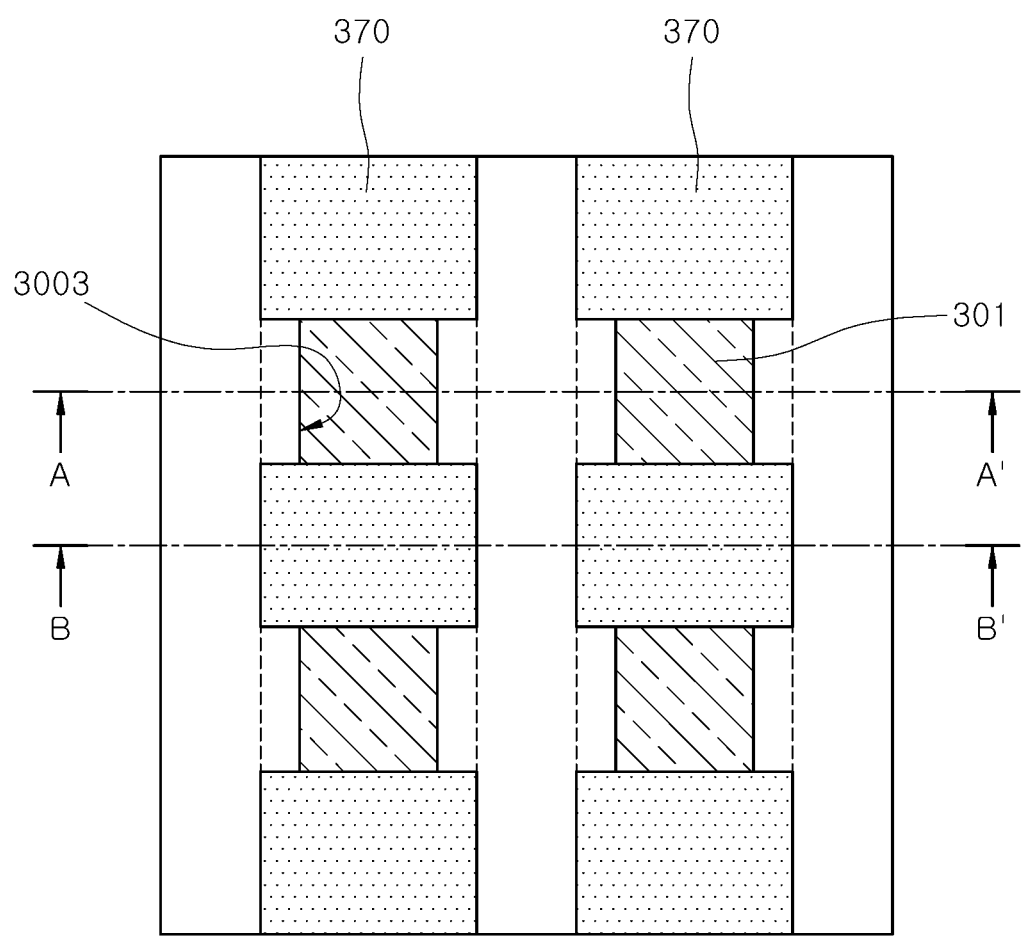
Figure 10B:
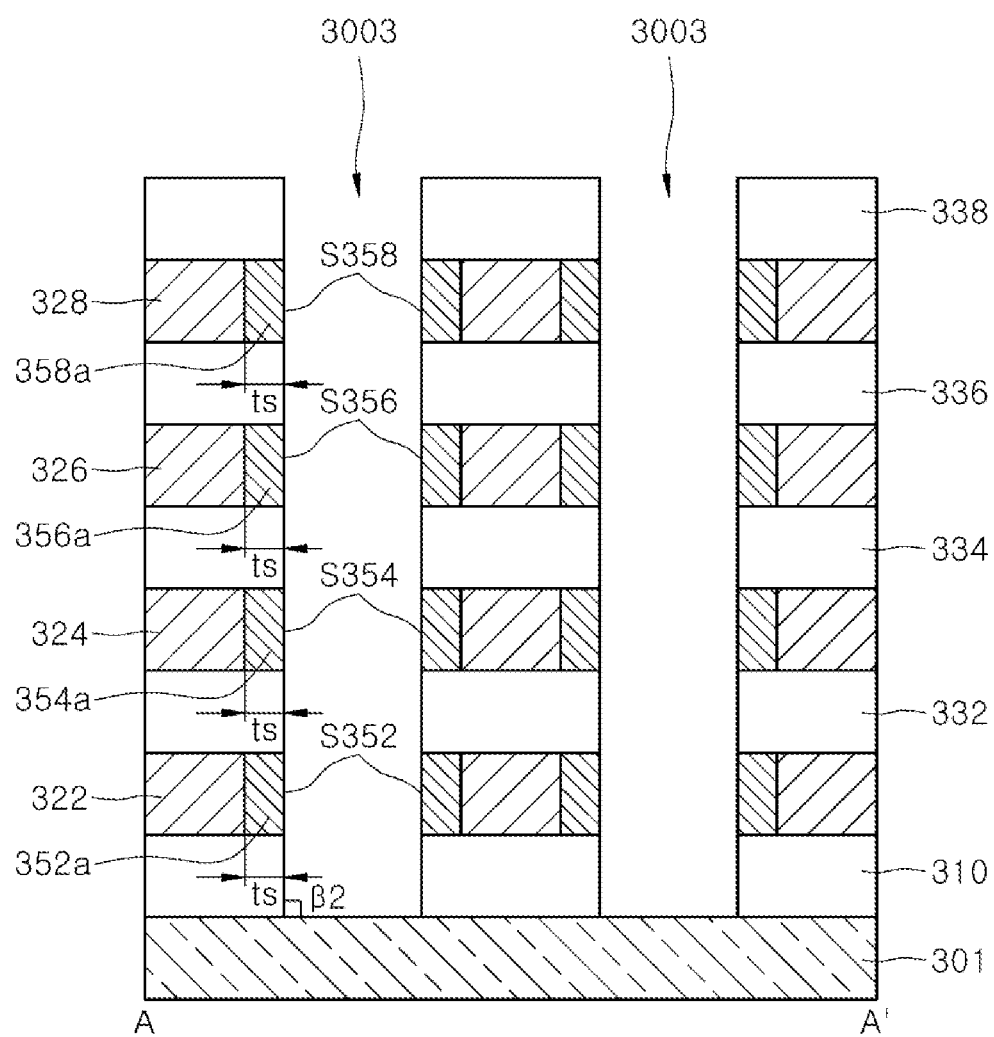
Figure 10C:
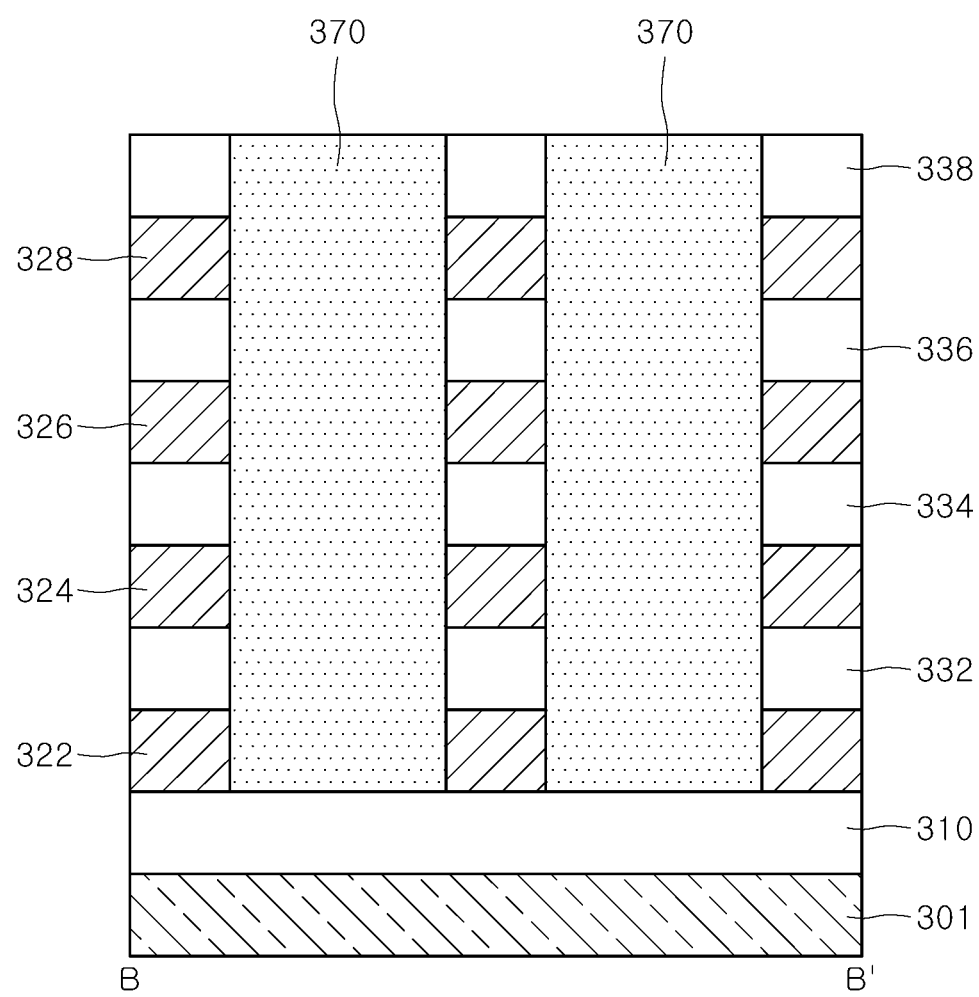

Referring to FIGS. 10A, 10B, and 10C, the first to fourth interlayer insulation layers 332, 334, 336, and 338, the first to fourth switching functional layers (352, 354, 356, and 358 of FIG. 9B), and the base insulation layer 310 may be selectively etched to form bit line contact holes 3003 exposing the substrate 301. The selective etching may be performed such that each of the first to fourth switching functional layers (352, 354, 356, and 358 of FIG. 9B) has a thickness remaining on side surfaces of the plurality of first to fourth word line structures 322, 324, 326, and 328, respectively. That is, some portions of the first to fourth switching functional layers (352, 354, 356, and 358 of FIG. 9B) may be left to remain on side surfaces of the plurality of first to fourth word line structures 322, 324, 326, and 328 after the selective etching that forms bit line contact holes 3003. Accordingly, first to fourth switching layers 352a, 354a, 356a, and 358a may be formed from the first to fourth switching functional layers remaining after the selective etching. Thicknesses ts of each of the first to fourth switching layers 352a, 354a, 356a, and 358a in the second lateral direction (i.e., x-direction) may be substantially the same.

Referring to FIG. 10B, each side surface of the bit line contact holes 3003 may have an inclination angle β2, which may be perpendicular to an upper surface of the substrate 301. The bit line contact holes 3003 may be formed by applying a lithography method and an anisotropic etching method.

In some embodiments, when the bit line contact holes 3003 are formed by the anisotropic etching, a polymer layer (not illustrated) containing carbon (C) may be formed on surfaces S352, S354, S356, and S358 of the first to fourth switching layers 352a, 354a, 356a, and 358a, which are exposed along the side surfaces of the bit line contact holes 3003. In an embodiment, the anisotropic etching may be performed by a dry etching method using plasma. In this case, a reactive gas including a chlorine-based gas and a hydrocarbon-based gas may be applied. The reaction gas may react with the first to fourth switching functional layers (352, 354, 356, and 358 of FIG. 9B) containing a chalcogenide-based material to etch the first to fourth switching functional layers (352, 354, 356, and 358 of FIG. 9B). At the same time, a polymer layer may be formed on side surfaces of the first to fourth switching functional layers (352, 354, 356, and 358 of FIG. 9B), and the polymer layer may remain after the etching is completed. The polymer layer may have a constant electrical resistance as described above with reference to FIGS. 3A, 3B, and 3C.

The bit line contact holes 3003 may expose side surfaces of the cell insulation layers 370 in the first lateral direction (i.e., y-direction). The bit line contact holes 3003 may expose side surfaces of the first to fourth switching layers 352a, 354a, 356a, and 358a, side surfaces of the first to fourth interlayer insulation layers 332, 334, 336, and 338, and side surfaces of the base insulation layer 310.

Figure 11A:
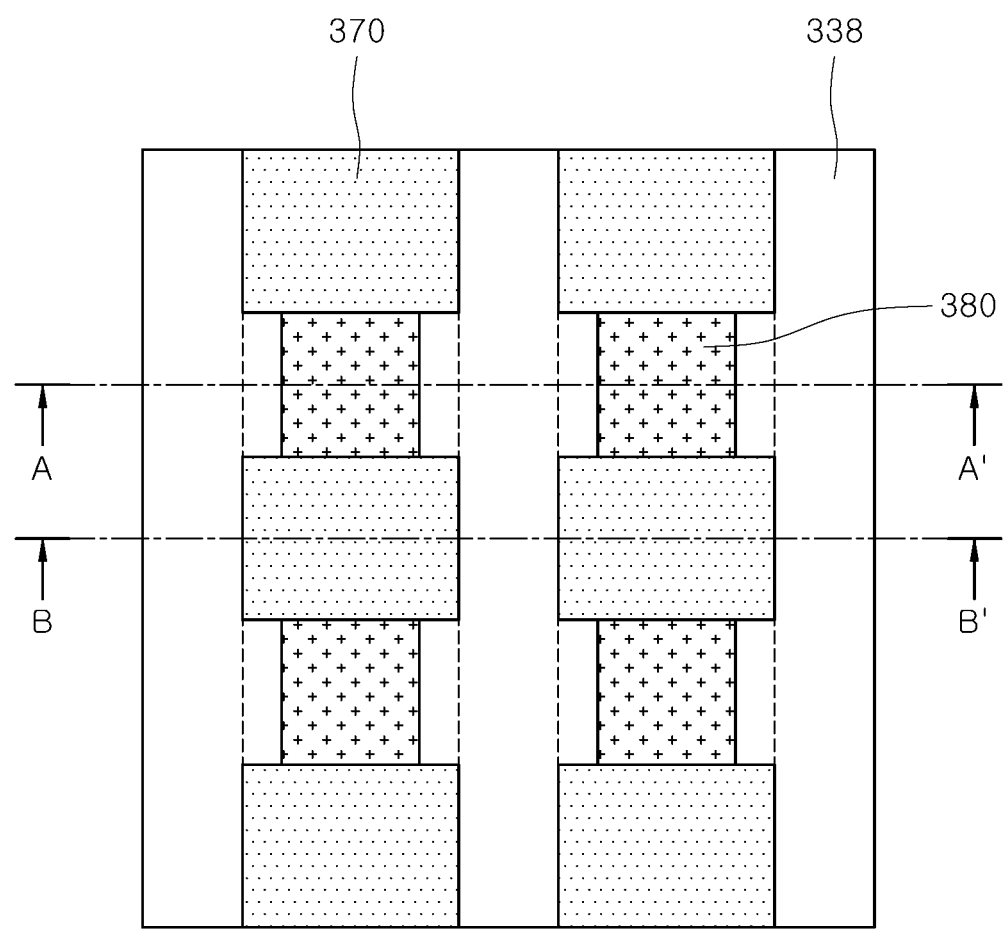
Figure 11B:
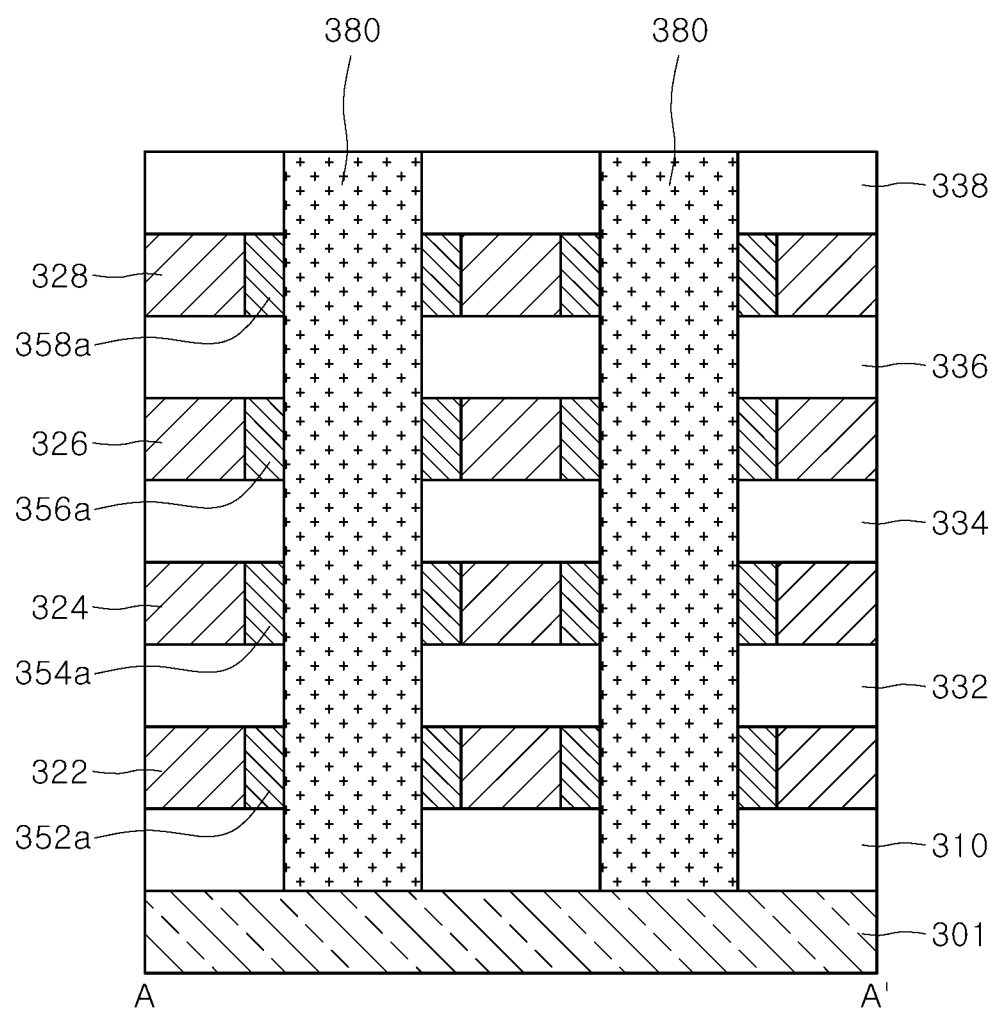
Figure 11C:
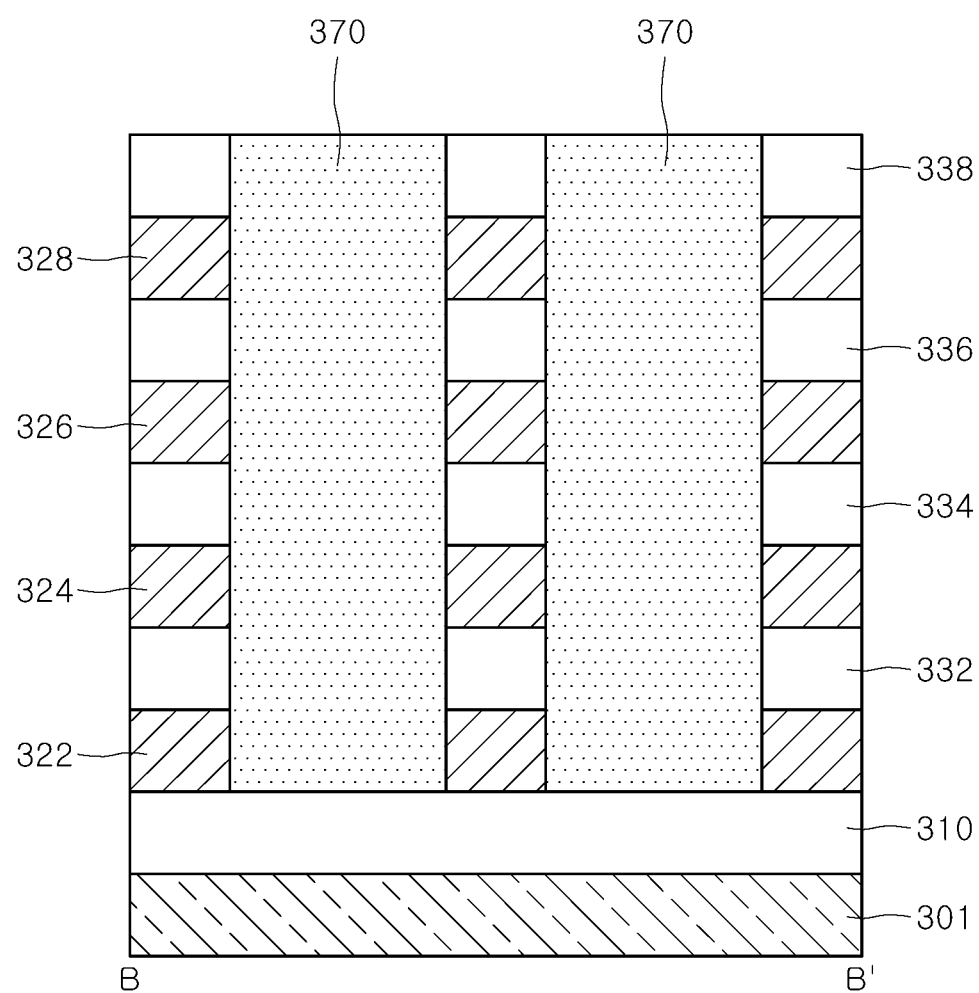

Referring to FIGS. 11A, 11B, and 11C, a conductive material may be provided in the bit line contact holes 3003 to form bit line structures 380. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, gallium arsenide (GaAs), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The bit line structures 380 may be formed by, for example, applying a physical vapor deposition method, a chemical vapor deposition method, and the like.

By performing the above-described processes, a semiconductor device according to an embodiment of the present disclosure can be manufactured.

In some embodiments, a side surface of each of the bit line contact holes 3003 might not have an inclination angle perpendicular to an upper surface of the substrate 301. Then, the process described above with respect to FIGS. 11A, 11B, and 11C may be performed to form the bit line structures 380. In this case, the shape of the bit line structure 380 may be substantially the same as the shape of the bit line structure 240 of the semiconductor device 1b described above with reference to FIG. 4.

In some embodiments, the process for forming the cell insulation contact holes 3002 described above with reference to FIGS. 8A, 8B, and 8C may be performed after performing the process for forming the bit line structures 380 described above with reference to FIGS. 11A, 11B, and 11C. In such cases, the generated cell insulation contact holes 3002 may expose the first to fourth switching layers 352a, 354a, 356a, and 358a, the first to fourth interlayer insulation layers 332, 334, 336, and 338, and the bit line structures 380 in the first lateral direction (i.e., y-direction), and may expose the plurality of first to fourth word line structures 322, 324, 326, and 328, and the first to fourth interlayer insulation layers 332, 334, 336, and 338 in the second lateral direction (i.e., x-direction). Thereafter, the cell insulation contact holes 3002 may be filled with an insulation material to form the cell insulation structures 370.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor device comprising:
   a substrate;
   a plurality of word line structures disposed over the substrate to be spaced apart from each other in a first direction perpendicular to a surface of the substrate, each of the plurality of word line structures extending in a second direction parallel to the surface of the substrate;
   a switching layer disposed over the substrate to contact side surfaces of the plurality of word line structures; and
   bit line structures disposed over the substrate to extend in the first direction and to contact a surface of the switching layer,
   wherein the switching layer is configured to perform a threshold switching operation and has a variable programmable threshold voltage,
   wherein a first contact surface of the switching layer that the switching layer contacts the side surfaces of the plurality of word line structures has substantially right angle with the substrate, and a second contact surface of the switching layer that the switching layer contacts side surfaces of the bit line structures has acute angle with the substrate.

2. The semiconductor device of claim 1, wherein the switching layer comprises a chalcogenide-based material.

3. The semiconductor device of claim 2, wherein the switching layer comprises one selected from the group consisting of germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), Tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), and germanium-tellurium-tin-platinum (Ge—Te—Sn—Pt).

4. The semiconductor device of claim 1, wherein the switching layer is configured to exhibit different threshold voltages depending on first and second program voltages, which have different polarities.

5. The semiconductor device of claim 1, further comprising a resistor layer containing carbon (C), which is disposed at an interface between the switching layer and the bit line structures.

6. The semiconductor device of claim 1, wherein an area of a cross-section, taken perpendicular to the first direction, of each of the bit line structures varies along the first direction.

7. The semiconductor device of claim 6, wherein an area of a cross-section of a lower portion of each of the bit line structures is smaller than an area of a cross-section of an upper portion of each of the bit line structures.

8. The semiconductor device of claim 1, wherein a width in a third direction, which is parallel to the surface of the substrate and perpendicular to the second direction, of a lowermost word line structure, from among the plurality of word line structures, is greater than a width of an uppermost word line structure.

\* \* \* \* \*